(12) United States Patent
Tseng et al.

(10) Patent No.: US 10,818,779 B2
(45) Date of Patent: Oct. 27, 2020

(54) METHOD AND STRUCTURE FOR MANDREL AND SPACER PATTERNING

(71) Applicant: Taiwan Semiconductor Manufacturing Co., Ltd., Hsin-Chu (TW)

(72) Inventors: Chi-Che Tseng, Hsin-Chu (TW); Chen-Yuan Wang, Hsin-Chu (TW); Wilson Hsieh, Hsin-Chu (TW); Yi-Hung Lin, Taipei (TW); Chung-Li Huang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/517,246

(22) Filed: Jul. 19, 2019

(65) Prior Publication Data

US 2019/0341474 A1 Nov. 7, 2019

Related U.S. Application Data

(62) Division of application No. 15/191,916, filed on Jun. 24, 2016, now Pat. No. 10,361,286.

(51) Int. Cl.
| | |
|---|---|
| *H01L 29/66* | (2006.01) |
| *H01L 21/8234* | (2006.01) |
| *H01L 21/66* | (2006.01) |
| *H01L 21/308* | (2006.01) |
| *G03F 1/38* | (2012.01) |

(52) U.S. Cl.
CPC .......... *H01L 29/66795* (2013.01); *G03F 1/38* (2013.01); *H01L 21/3086* (2013.01); *H01L 21/823431* (2013.01); *H01L 22/12* (2013.01); *H01L 22/20* (2013.01); *H01L 22/30* (2013.01); *H01L 29/6653* (2013.01); *H01L 29/6656* (2013.01)

(58) Field of Classification Search
CPC ............. H01L 21/0271; H01L 29/6653; H01L 29/6656; H01L 21/3086
See application file for complete search history.

(56) References Cited

U.S. PATENT DOCUMENTS

| | | |
|---|---|---|
| 7,449,348 B1 | 11/2008 | Dakshina-Murthy et al. |
| 8,039,179 B2 | 10/2011 | Shieh et al. |
| 8,202,681 B2 | 6/2012 | Lin et al. |
| 8,728,332 B2 | 5/2014 | Lin et al. |
| 8,822,243 B2 | 9/2014 | Yan et al. |
| 8,980,756 B2 | 3/2015 | Tran et al. |
| 2006/0091468 A1 | 5/2006 | Liaw |
| 2011/0233505 A1 | 9/2011 | Nitta |
| 2011/0281208 A1 | 11/2011 | Lin et al. |
| 2012/0278776 A1 | 11/2012 | Lei et al. |
| 2013/0295769 A1 | 11/2013 | Lin et al. |
| 2013/0320451 A1 | 12/2013 | Liu et al. |
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |

*Primary Examiner* — Daborah Chacko-Davis
(74) *Attorney, Agent, or Firm* — Haynes and Boone, LLP

(57) ABSTRACT

An IC manufacturing method includes forming first mandrels and second mandrels over a substrate; and forming first spacers on sidewalls of the first mandrels and second spacers on sidewalls of the second mandrels. Each of the first and second spacers has a loop structure with two curvy portions connected by two lines. The method further includes removing the first and second mandrels; and removing the curvy portions from each of the first spacers without removing the curvy portions from the second spacers. The second spacers are used for monitoring variations of the IC fabrication processes.

20 Claims, 19 Drawing Sheets

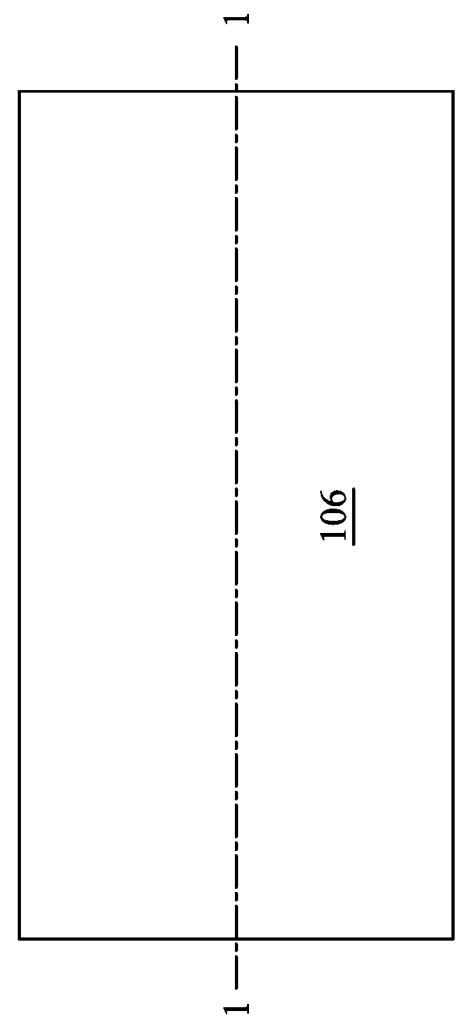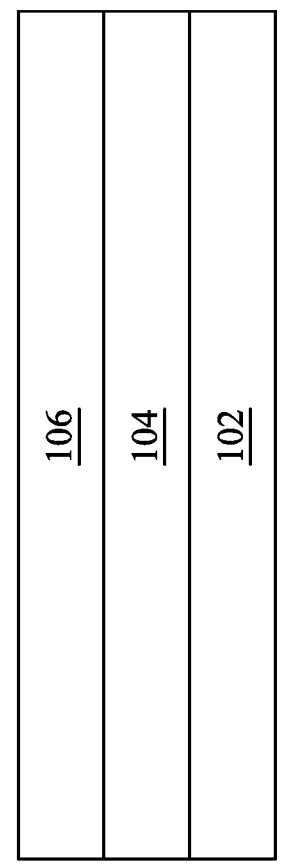

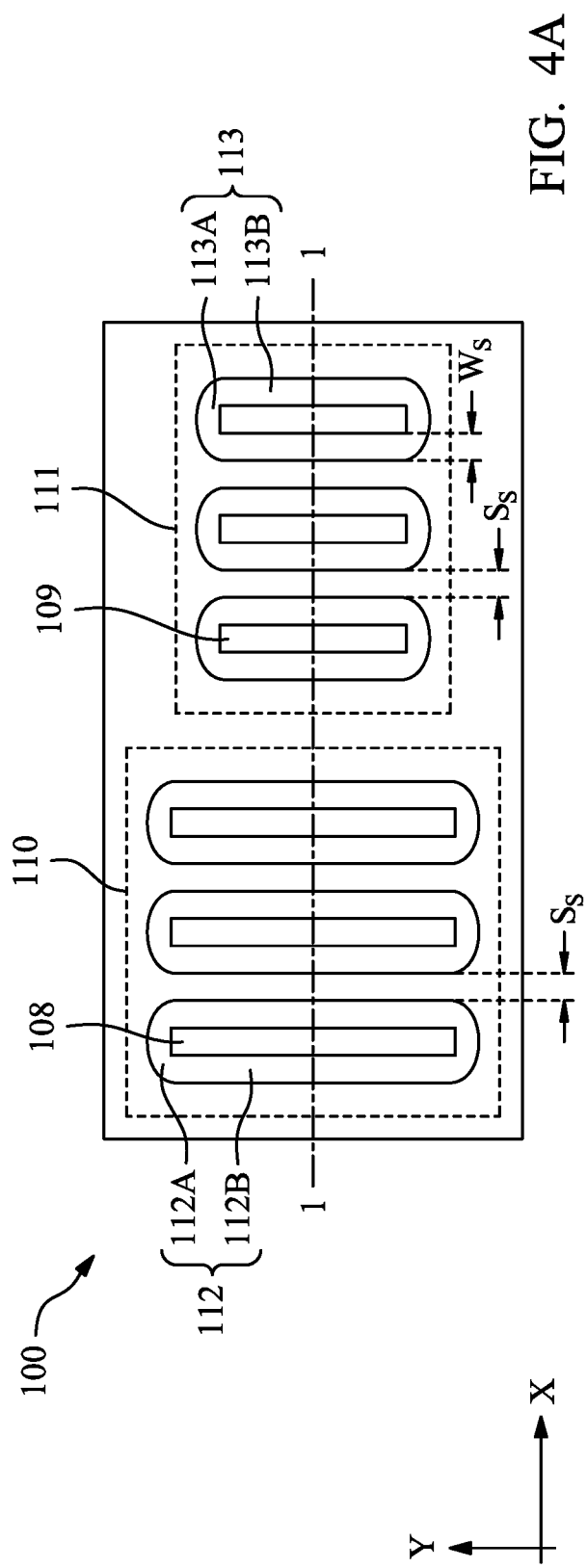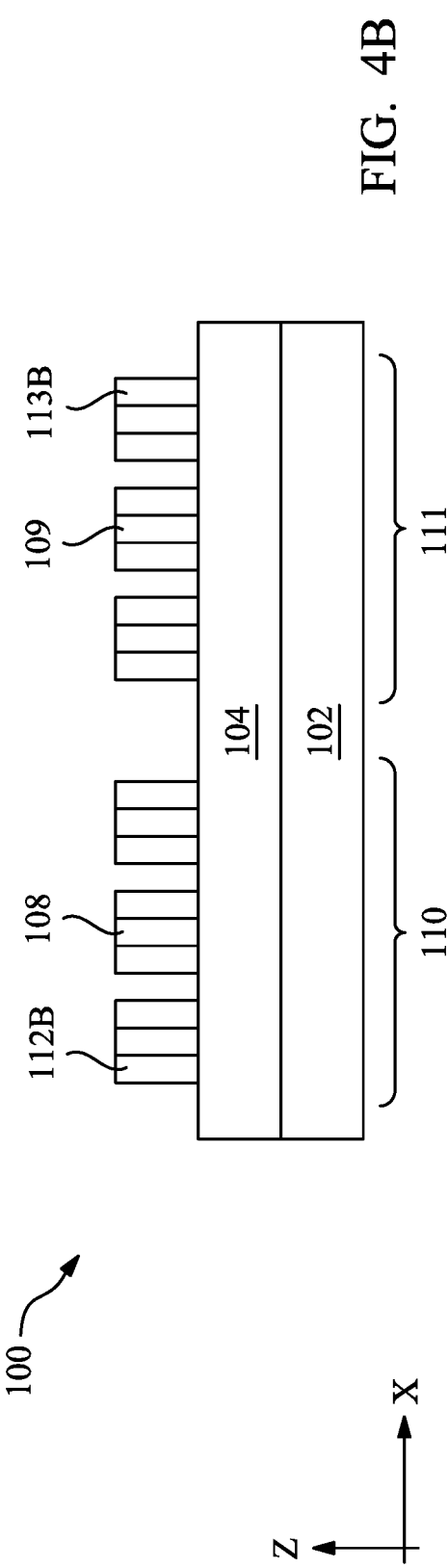
FIG. 4A
FIG. 4B

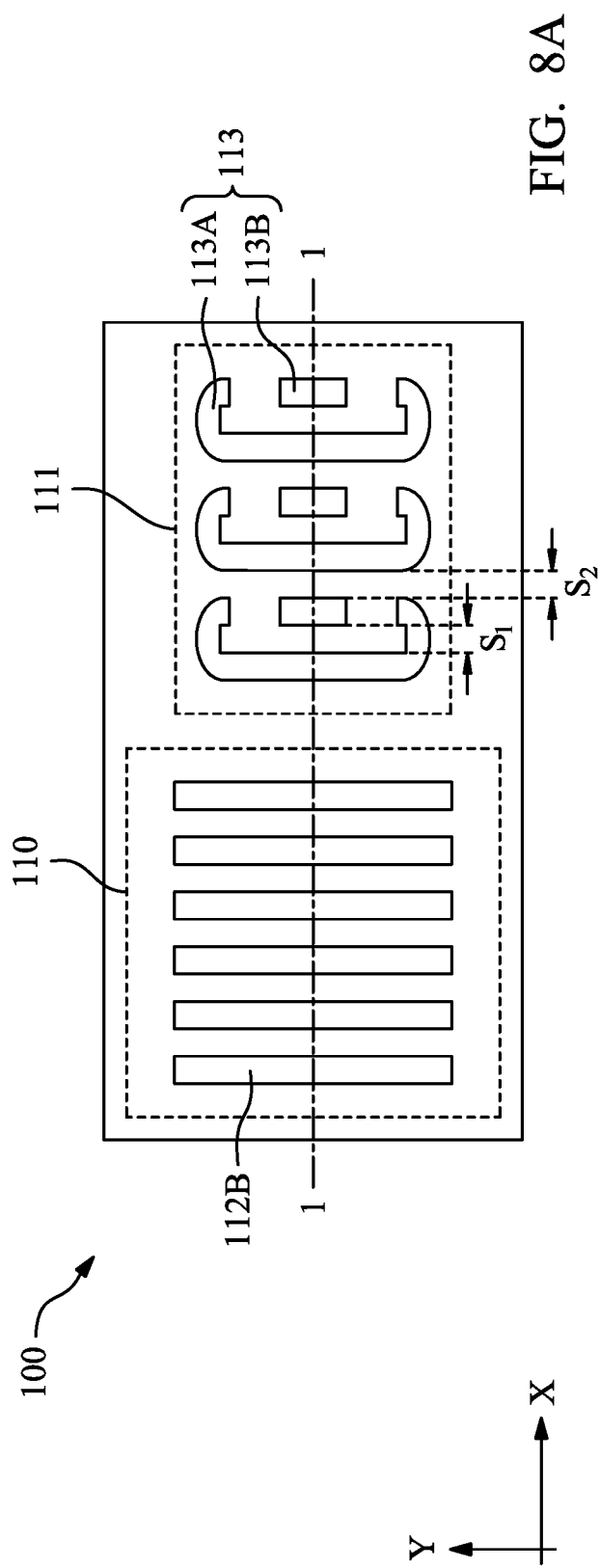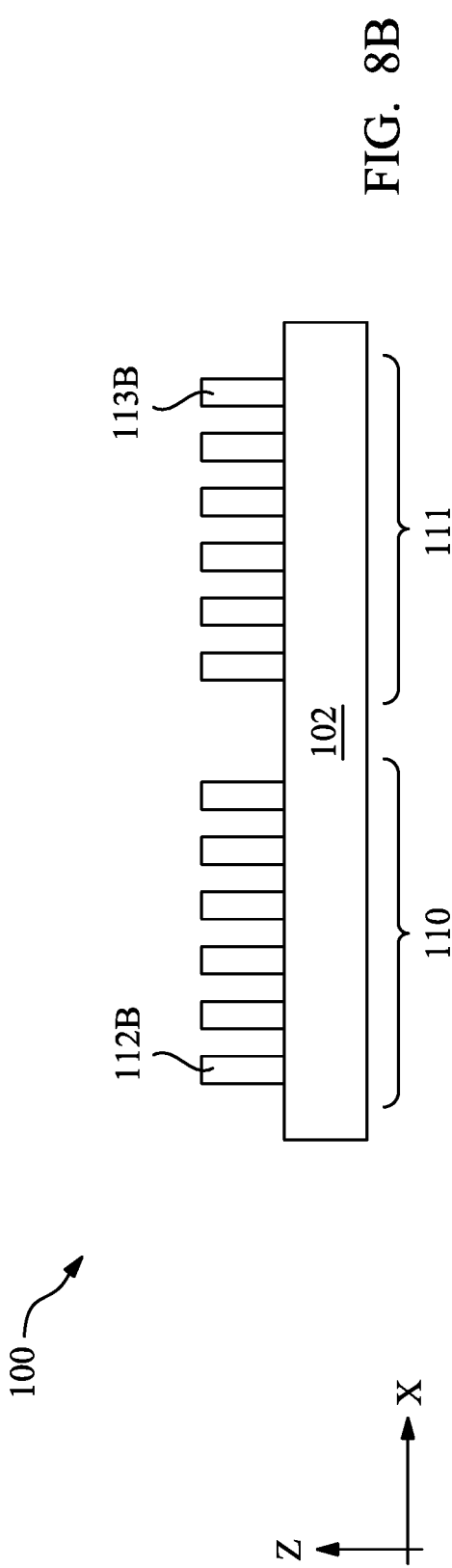
FIG. 8A
FIG. 8B

METHOD AND STRUCTURE FOR MANDREL AND SPACER PATTERNING

PRIORITY

This is a divisional of U.S. application Ser. No. 15/191,916 filed on Jun. 24, 2016, the entire disclosure of which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, traditional photolithography alone can no longer meet the requirements for critical dimension (CD) and pattern density in advanced process nodes, such as 10 nanometer (nm) or smaller. Frequently, a spacer technique is used for doubling the exposed pattern in advanced photolithography. That is, the pitch of a final pattern is reduced to only half compared with the first exposed pattern. In a typical spacer technique, a mandrel pattern is formed using photolithography, and a spacer is formed around the mandrel pattern. Subsequently, the mandrel pattern is removed, and the spacer is partially removed by a photolithography cut process. The final pattern includes the remaining portion of the spacer, and/or its derivative. Frequently, the parameters of the final pattern (e.g., CD, pitch, and spacing) are measured for process control purposes. However, the final pattern is usually just a set of long parallel lines and it is difficult to map the dimensions of the final pattern back to the various steps in the pattern formation process.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIGS. 2A, 3A, 4A, 5A, 6A, 7A, 8A, 9A, and 10A illustrate top views of a device in various manufacturing steps of the method in FIG. 1, in accordance with some embodiments.

FIGS. 2B, 3B, 4B, 5B, 6B, 7B, 8B, 9B, and 10B illustrate cross-sectional views of the device in FIGS. 2A-10A along the "1-1" line therein, respectively, in various manufacturing steps of the method in FIG. 1, in accordance with some embodiments.

DETAILED DESCRIPTION

Figure 1:
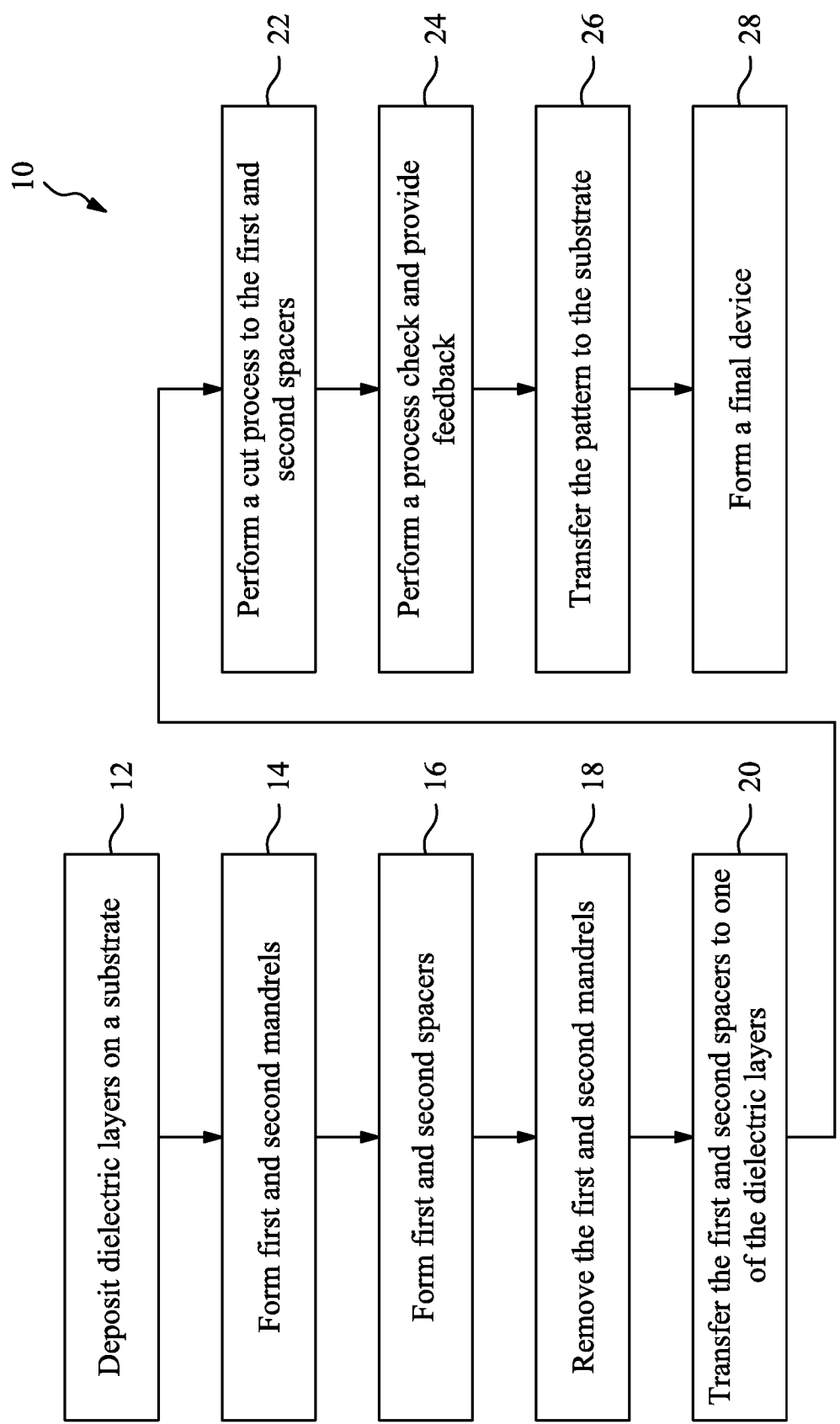
FIG. 1 illustrates a flowchart of a method of patterning a substrate according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods of forming semiconductor devices. More particularly, the present disclosure is related to forming semiconductor devices using mandrel-spacer techniques. The mandrel-spacer techniques include self-aligned double patterning (SADP) process which reduces the pitch of the exposed pattern by half, self-aligned quadruple patterning (SAQP) process which reduces the pitch of the exposed pattern by a quarter, and other spacer patterning processes. According to some embodiments of the present disclosure, a pitch monitor (PM) pattern is formed in addition to the main pattern for an IC device. The PM pattern may be formed in a circuit area or in a non-circuit area such as scribe lines on a wafer. The mandrel-spacer process is performed to both the main pattern and the PM pattern. A final pattern derived from the PM pattern is used for monitoring the process conditions and fine-tuning the fabrication processes for the final pattern derived from the main pattern.

FIG. 1 is a high-level flowchart of a method 10 of manufacturing an IC device 100 according to various aspects of the present disclosure. The method 10 is merely an example for illustrating various aspects of the provided subject matter. Additional operations can be provided before, during, and after the method 10, and some operations described can be replaced, eliminated, or moved around for additional embodiments of the method. The various operations in FIG. 1 are discussed below in conjunction with FIGS. 2A-10A and 2B-10B.

At operation 12, the method 10 (FIG. 1) deposits dielectric layers over a substrate 102 in preparation for patterning the substrate 102 and forming the IC device 100 thereon and/or therein. Referring to FIGS. 2A and 2B, two exemplary dielectric layers 104 and 106 are deposited over the substrate 102. The substrate 102 includes silicon in the present embodiment, such as a semiconductor wafer. In various embodiments, the substrate 102 may include another elementary semiconductor, such as germanium; a compound semiconductor, such as silicon carbide, indium arsenide, or indium phosphide; or an alloy semiconductor, such as silicon germanium carbide, gallium arsenic phosphide, or gallium indium phosphide. Materials suitable for the dielectric layers 104 and 106 include, but not limited to, silicon oxide, silicon nitride, poly-silicon, silicon oxynitride, tetraethyl orthosilicate (TEOS), nitrogen-containing oxide, nitride oxide, high-k dielectric materials, low-k dielectric materials, or combinations thereof. The dielectric layers 104 and 106 are each formed by one or more deposition techniques, such as thermal oxidation, chemical vapor deposition (CVD), physical vapor deposition (PVD), plasma-enhanced CVD (PECVD), and atomic layer deposition (ALD). In various embodiments, more than two dielectric layers may be formed over the substrate 102 and used for the purposes of patterning the substrate 102. The more than two dielectric layers include the dielectric layers 104 and 106, and further include other dielectric layers between, above, or below the dielectric layers 104 and 106.

Figure 3A:
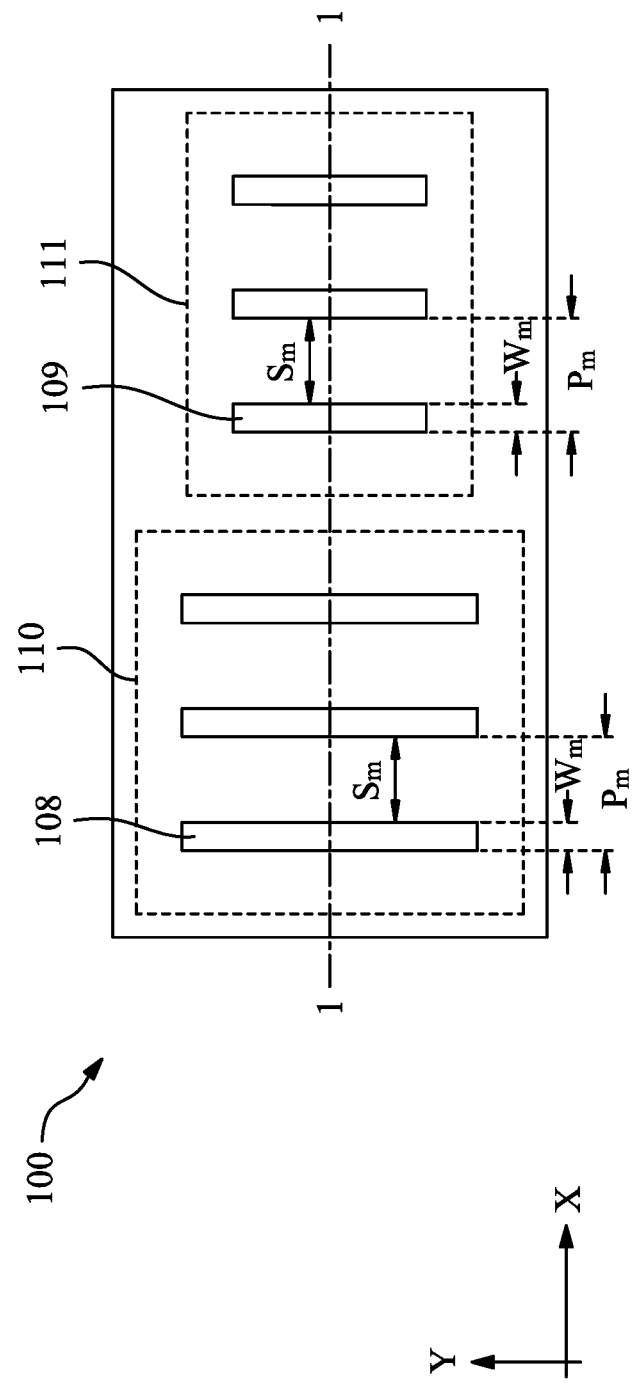
Figure 3B:
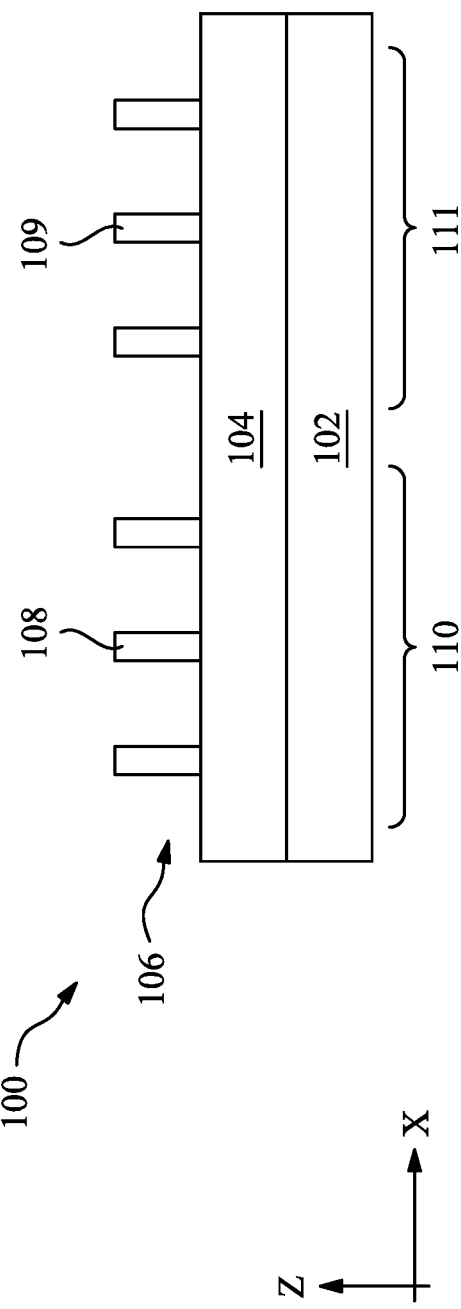

At operation 14, the method 10 (FIG. 1) forms first mandrel patterns 108 and second mandrel patterns 109 in the dielectric layer 106. Refer to FIGS. 3A and 3B, which show top and cross-sectional views of the device 100 with the mandrel patterns 108 and 109 formed on. In an embodiment, the mandrel patterns 108 are used for defining a plurality of fins in the substrate 102 for forming fin-like field effect transistors (FinFETs) using mandrel-spacer techniques. In the present embodiment, the mandrel patterns 109 are used for monitoring the process conditions for the above FinFET formation. In the embodiment shown, the mandrel patterns 108 are formed in a region 110 and the mandrel patterns 109 are formed in another region 111. In an embodiment, the region 110 is a circuit area of the IC device 100 where active devices (such as transistors) or passive devices (such as resistors, capacitors, and inductors) exist or to be formed in the substrate 102. The region 111 may be a circuit area or a non-circuit area in various embodiments. In one example, the region 111 is in the same circuit area as the region 110. In another example, the region 111 is located close to the region 110, but in a non-circuit area. In yet another example, the region 111 is in a scribe line area of a wafer, distant from the region 110.

Still referring to FIGS. 3A and 3B, in the present embodiment, the mandrel patterns 108 and 109 are elongated members that are oriented lengthwise in the same direction "Y," and have the same width $W_m$ and the same pitch $P_m$ along the direction "X." The spacing $S_m$ between two adjacent mandrel patterns equals to $(P_m-W_m)$. The mandrel patterns 109 are shorter in length than the mandrel patterns 108. In an embodiment, the mandrel patterns 109 are designed such that multiple mandrel patterns 109 can be fully viewed in a viewing area of a metrology tool such as a scanning electron microscope (SEM). For example, the length of the mandrel patterns 109 may be around 300 nm or smaller in some embodiments. The rationale for the shorter length of the mandrel patterns 109 will become evident in a later discussion. In embodiments, the length, width, and pitch of the mandrel patterns 108 are determined by a circuit designer and presented in a design layout. Then, the length, width, and pitch of the mandrel patterns 109 are determined based on the aspects of the present disclosure, and are added to the design layout. Subsequently, the design layout having the definitions of both mandrel patterns 108 and 109 is presented to a mask-making facility and a mask (or photomask) is made accordingly. The mask includes features for forming the mandrel patterns 108 and 109.

In an embodiment, the mandrel patterns 108 and 109 are formed by a procedure including a photolithography process and an etching process. For example, a photoresist (or resist) layer is formed on the dielectric layer 106 using a spin-coating process and soft baking process. Then, the photoresist layer is exposed to a radiation using the mask having the definitions for the mandrel patterns 108 and 109. The exposed photoresist layer is developed using post-exposure baking, developing, and hard baking thereby forming a patterned photoresist layer over the dielectric layer 106. Subsequently, the dielectric layer 106 is etched through the openings of the patterned photoresist layer, forming the mandrel patterns 108 and 109. The etching process may include a dry (or plasma) etching, a wet etching, or other suitable etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The patterned photoresist layer is removed thereafter using a suitable process, such as wet stripping or plasma ashing.

At operation 16, the method 10 (FIG. 1) forms first spacers 112 on sidewalls of the first mandrel patterns 108 and forms second spacers 113 on sidewalls of the second mandrel patterns 109. Referring to FIGS. 4A and 4B, the spacers 112 and 113 are formed around the respective mandrel patterns 108 and 109 to have a loop structure. Particularly, the spacers 112 each have two curvy portions (or curvy ends) 112A and two relatively straight portions (or walls) 112B. The two curvy portions 112A are connected by the two straight portions 112B. Similarly, the spacers 113 each have two curvy portions 113A connected by two relatively straight portions 113B. The spacers 112 and 113 are formed to have a width (or thickness) $W_s$. The spacing $S_s$ between the walls of the spacers 112 and 113 equals to $(S_m-2\times W_s)$. The spacers 112 and 113 include one or more materials different from the mandrel patterns 108 and 109. In an embodiment, the spacers 112 and 113 may include a dielectric material, such as titanium nitride, silicon nitride, or titanium oxide. The spacers 112 and 113 can be formed by various processes, including a deposition process and an etching process. For example, the deposition process may include a CVD process or a PVD process. For example, the etching process may include an anisotropic etch such as plasma etch. In the present embodiment, the spacers 112 and 113 are formed by the same process.

Figure 5A:
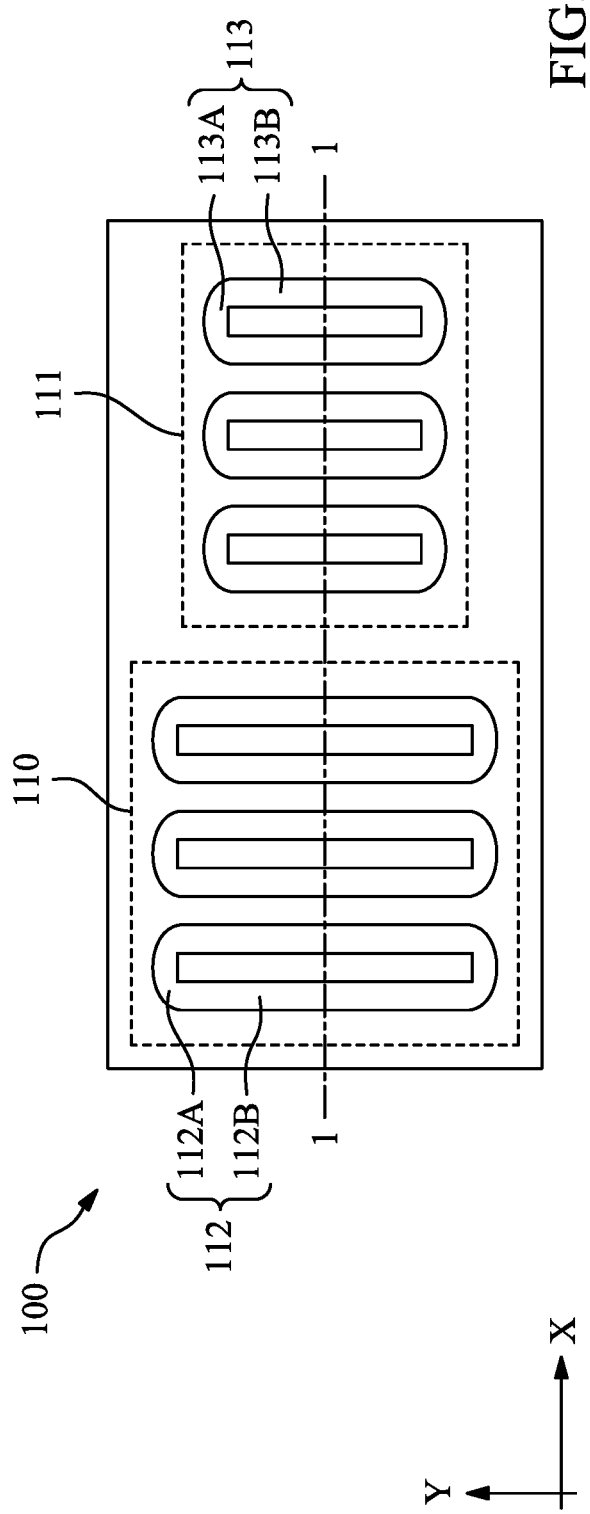
Figure 5B:
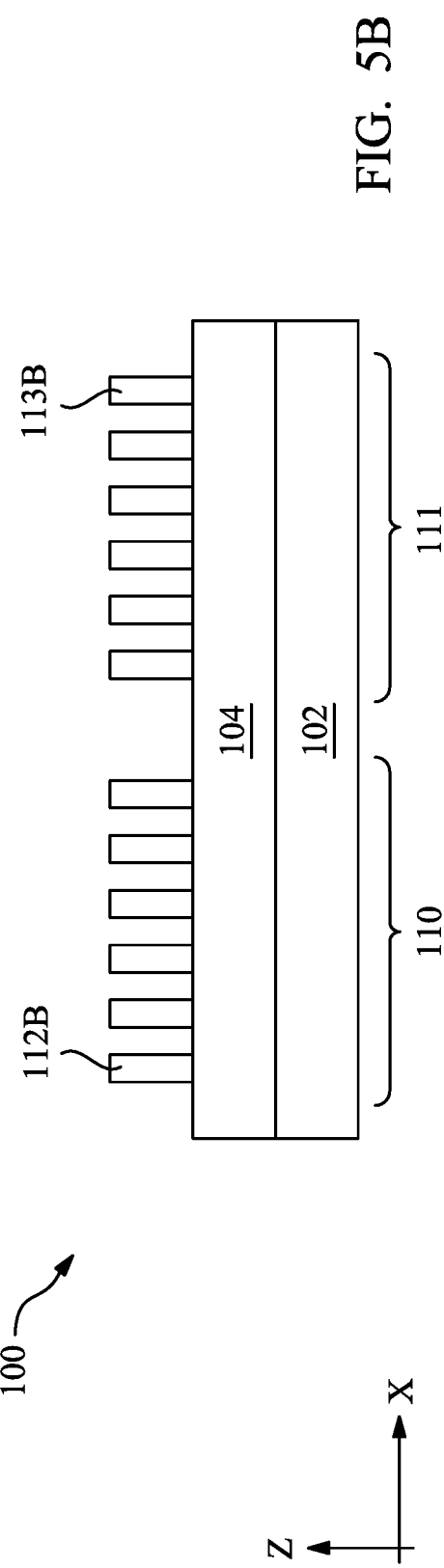
Figure 6A:
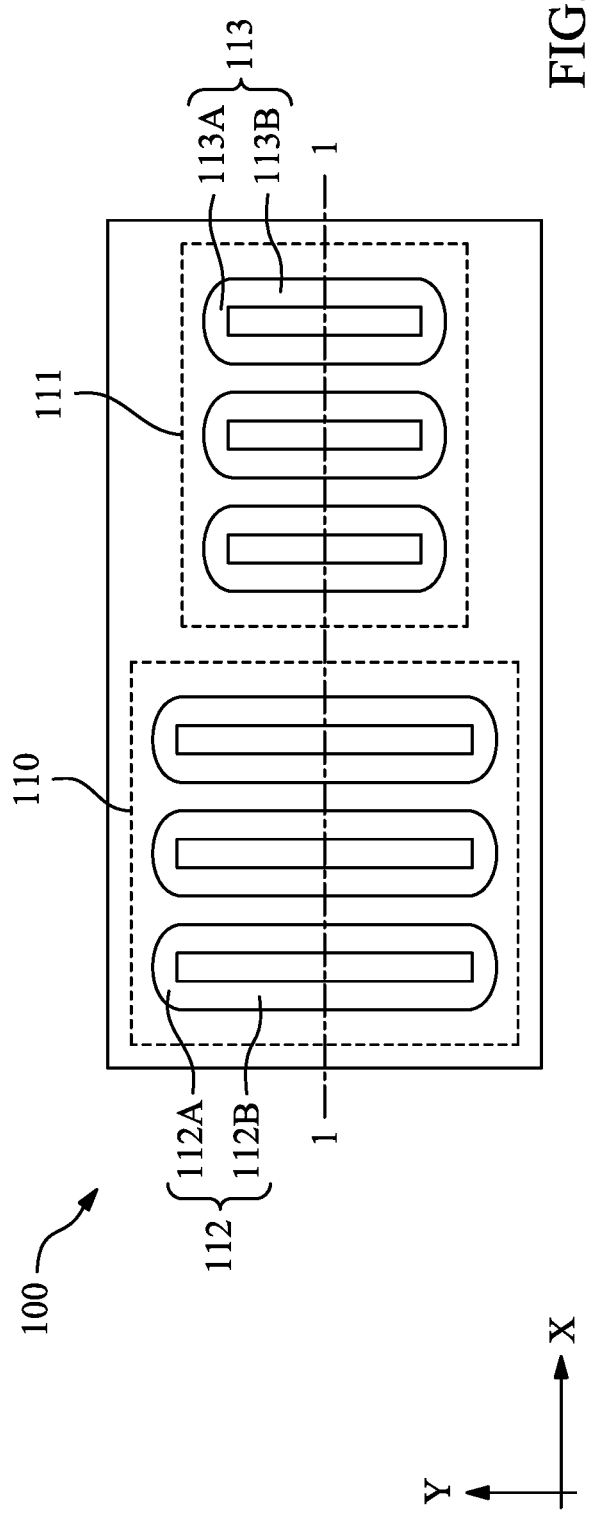
Figure 6B:
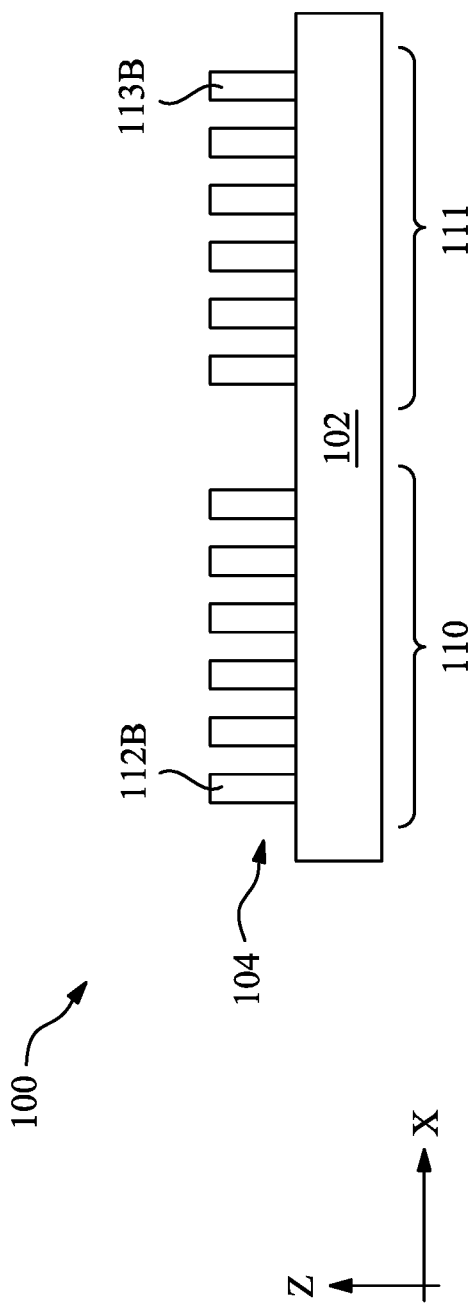

At operation 18, the method 10 (FIG. 1) removes the mandrel patterns 108 and 109 by an etching process. Referring to FIGS. 5A and 5B, the spacers 112 and 113 remain standing over the dielectric layer 104 after the mandrel patterns 108 and 109 are removed. In an embodiment, operation 18 uses an etching process selectively tuned to remove the materials of the mandrel patterns 108 and 109 but not the materials of the spacers 112 and 113. The etching process can be a wet etching, a dry etching, or a combination thereof. As shown, each of the spacers 112 and 113 still has the loop structure discussed above.

At operation 20, the method 10 (FIG. 1) transfers the patterns of the spacers 112 and 113 to the dielectric layer 104. In an embodiment, operation 20 includes an etching process that etches the dielectric layer 104 with the spacers 112 and 113 as an etch mask, thereby transferring the patterns from the dielectric layer 106 to the dielectric layer 104. In various embodiments, there may be intermediate layers between the dielectric layers 104 and 106. To further those embodiments, the intermediate layers are etched with the spacers 112 and 113 as an etch mask, and the dielectric layer 104 is subsequently etched with the patterned intermediate layers as an etch mask. In embodiments, the same etching process is performed to the regions 110 and 111. For the convenience of discussion, the patterns of the spacers 112 and 113 at the dielectric layer 104 are still referred to as the spacers 112 and 113, respectively. In an embodiment, operation 20 is optional, i.e. the spacers 112 and 113 remain standing over the dielectric layer 104 when presented to the next operation 22.

Figure 7A:
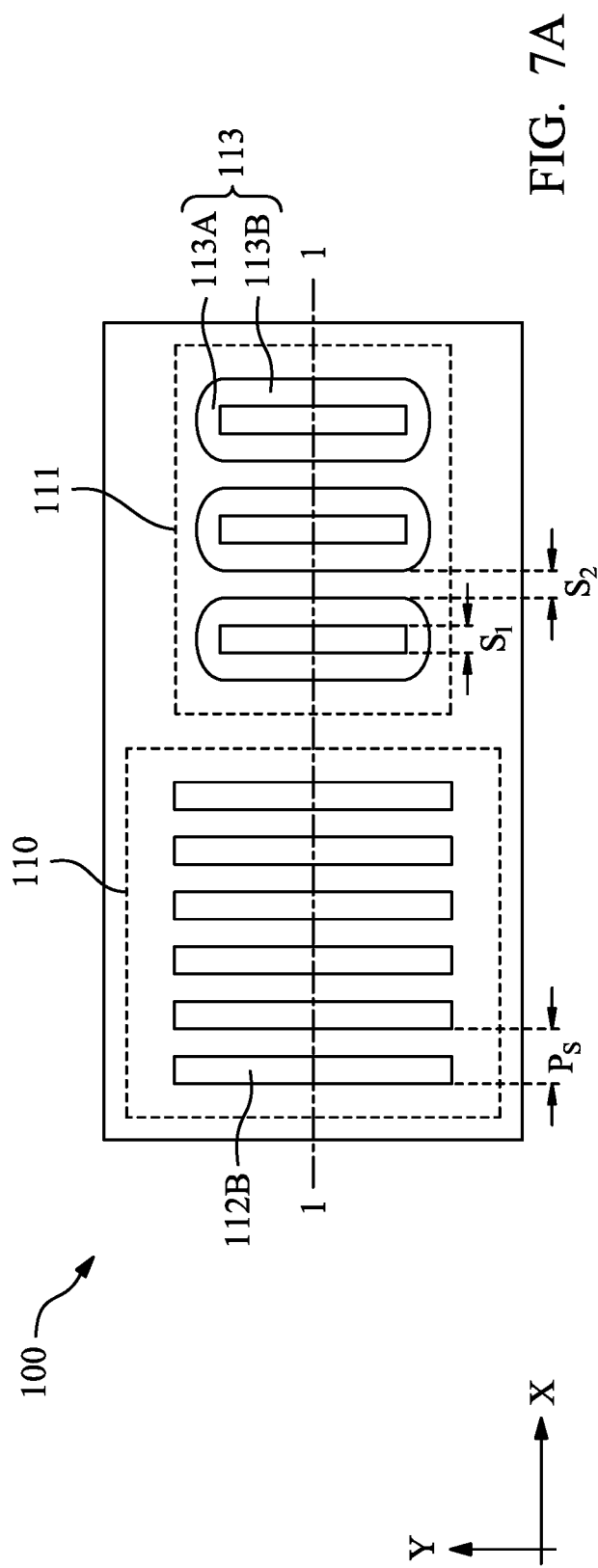
Figure 7B:
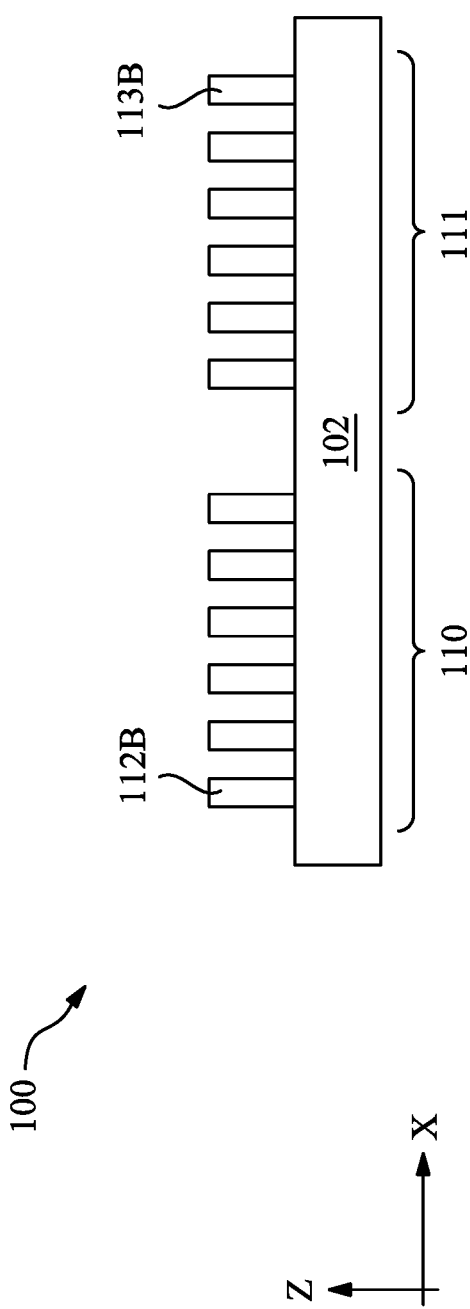

At operation 22, the method 10 (FIG. 1) performs a cut process to the spacers 112 and 113. In an embodiment, the cut process removes the curvy portions 112A from the spacers 112, but does not remove the curvy portions 113A from the spacers 113. FIGS. 7A and 7B show a result of the cut process according to this embodiment. Referring to FIGS. 7A and 7B, in the region 110, a set of substantially parallel lines result from the relatively straight portions 112B of the spacers 112. These lines are also referred to as the lines 112B for the convenience of discussion. The lines 112B have a pitch $P_s$ which is about half of the pitch $P_m$ of the mandrel patterns 108 (FIG. 3A). In the region 111, the spacers 113 still have the loop structure. In an embodiment, the cut process includes one or more of deposition, photolithography, and etching processes. For example, a masking layer (e.g., a photoresist) is formed over the spacers 112 and 113. The masking layer is patterned (e.g., using a photolithography process) to expose the portions of the spacers 112 and 113 that are to be removed. Subsequently, the exposed portions of the spacers 112 and 113 are etched, and the masking element is thereafter removed.

In an embodiment, the lines 112B, or a derivative thereof, are used for forming silicon fins in the substrate 102. To improve circuit performance, a great uniformity of the lines 112B is desired. The measures for the uniformity include the width of the lines 112B and the spacing between the lines 112B. Factors contributing to the width (or variations thereof) of the lines 112B include the material and thickness of the spacers 112, the etch selectivity in operation 18, the etching process used in the formation and transferring of the spacers 112, among other factors. Factors contributing to the spacing (or variations thereof) of the lines 112B include various conditions for the photolithography process in forming the mandrel patterns 108, the width and spacing of the mandrel patterns 108, the thickness of the spacers 112, the etch selectivity in operation 18, among other factors. It is frequently desirable to measure various dimensions of the lines 112B in order to provide feedback to, and fine-tune, the various processes above. However, one difficulty is how to map the measurements (e.g., spacing between the lines 112B) to the formation processes above. As illustrated in FIG. 7A, it is difficult to know which spacing between the lines 112B correspond to the width $W_m$ of the mandrel patterns 108 (FIG. 3A) and which spacing between the lines 112B correspond to the spacing $S_s$ of the spacers 112 (FIG. 4A). Particularly, the lines 112B may be relatively long and may exceed one viewing area of commercial metrology tools, which makes it time-consuming to navigate through a big area of the IC device 100 in order to find a boundary of the lines 112B.

In the present embodiment, the spacers 113 serve as a monitoring device for the lines 112B. As shown in FIG. 7A, the spacers 113 have the loop structure discussed above. The spacing $S_1$ between opposing inner sidewalls of the loop structure corresponds to the width of the mandrel pattern 109 (FIG. 4A). The spacing $S_2$ between two outer sidewalls of adjacent loop structures corresponds to the spacing $S_s$ (FIG. 4A). According to one aspect of the present disclosure, the spacers 113 are relatively short so as to fit into one viewing area of the metrology tool for the measurements. The unique shape of the spacers 113 can be located relatively quickly using the metrology tool and the corresponding measurements (width, spacing, pitch, etc.) are then taken. Since the spacers 113 and the lines 112B have undergone the same fabrication process (it is noted that the cut process in operation 22 has a negligible influence on the dimensions of the spacers 113 and the lines 112B along the "X" direction), the measurements of the spacers 113 can be used for monitoring the formation processes of the lines 112B and for providing feedback thereto.

At operation 24, the method 10 (FIG. 1) performs a process check with the measurements of the spacers 113 and provide feedback as needed. In an embodiment, operation 24 checks the spacing $S_1$ according to, or against, a CD target. If the spacing $S_1$ does not meet the CD target, a feedback to operation 14 is generated. Operation 14 may use the feedback to fine-tune various process conditions for forming the mandrel patterns 108 and 109 (FIG. 3A), such as process recipes associated with exposure, developing, and etching processes. In an embodiment, operation 24 further checks the spacing $S_2$ according to another CD target. If the spacing $S_2$ does not meet the CD target, another feedback is generated. This feedback may be used by operations 16, 18, and/or 20. For example, operation 16 may use the feedback to fine-tune the material and deposition parameters for forming the spacers 112 and 113. For example, operation 18 may use the feedback to fine-tune the etch selectivity in removing the mandrel patterns 108 and 109. The above are non-limiting examples of measuring the dimensions of the spacers 113 and providing feedback to the formation of the lines 112B. In various embodiments, operation 24 may measure the pitch, width, spacing, or other dimensions of the spacers 113, and may provide feedback to one or more of the operations 12, 14, 16, 18, 20, and 22. The unique shape of the spacers 113 enables quick and effective process monitoring.

Figure 9A:
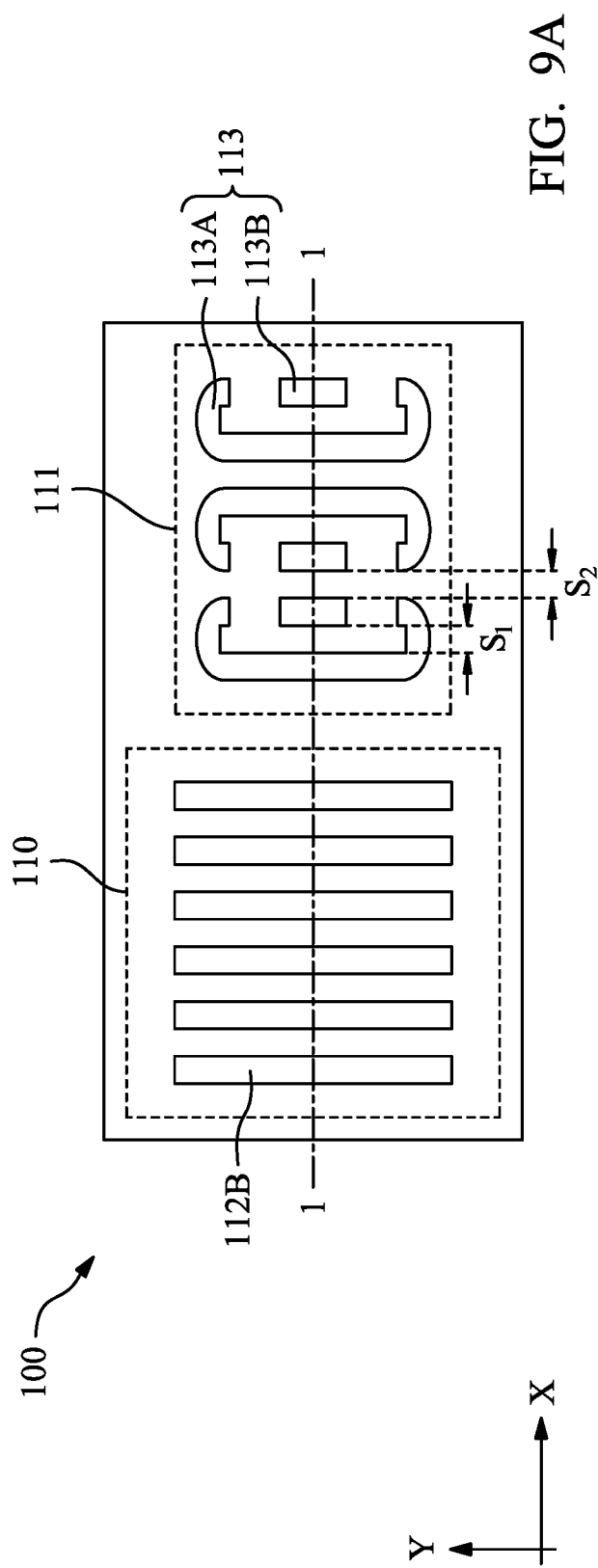
Figure 9B:
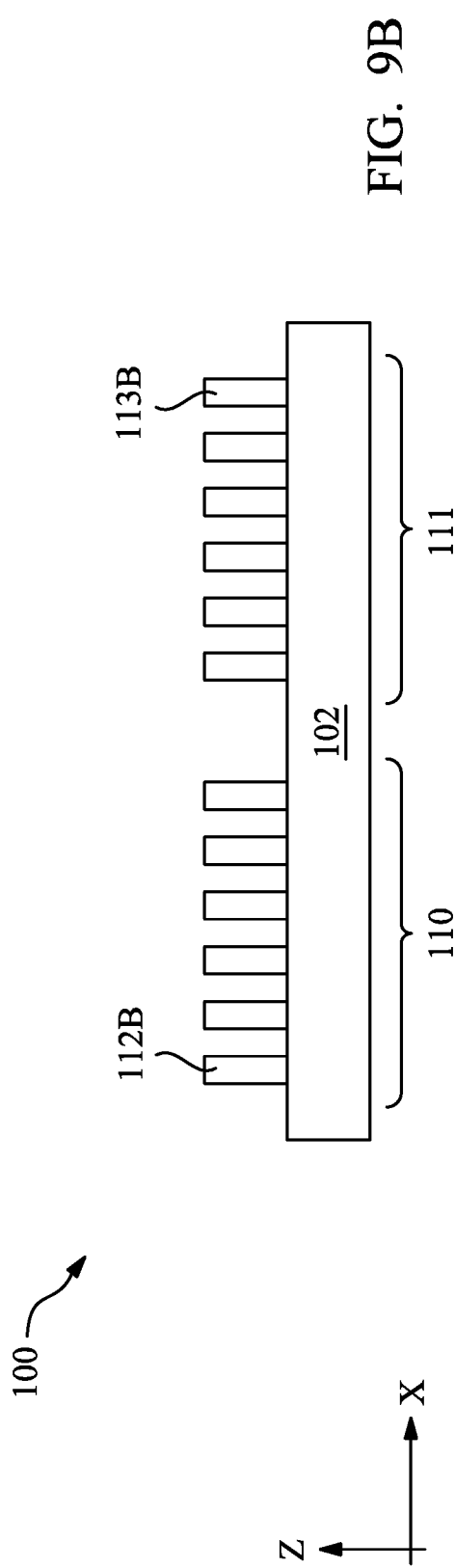

The shape of the spacers 113 is not limited to the loop structure as shown in FIG. 7A. In an embodiment, the spacers 113 are partially removed in the cut process in operation 22. Some examples of this embodiment are shown in FIGS. 8A and 9A. Referring to FIGS. 8A and 9A, each of the spacers 113 is partially removed, thereby splitting the respective spacer 113 into two segments, a shorter segment and a longer segment. The shorter segment is part of the straight portion 113B, and the longer segment includes the curvy portions 113A. In FIG. 8A, a longer segment is between two shorter segments, forming a repeating pattern of short, long, short, and long. In FIG. 9A, a shorter segment from one spacer 113 is adjacent to another shorter segment from another spacer 113, forming a repeating pattern of short, short, long, and long. Other variations of the spacers 113 are possible. For example, the spacers 113 may be partially removed in the straight portion to form a gap, but the remaining portions are connected (not segmented). In various embodiments, the spacers 113 may be cut (as illustrated in FIGS. 8A and 9A) to keep a pattern loading balance with the cut process performed to the spacers 112. However, the unique structures of the spacers 113 are readily recognizable for process monitoring purposes. Further, in the embodiments shown in FIGS. 8B and 9B, the respective cross-sectional views of the device 100 along the "1-1" line remain the same as in FIG. 7B.

Figure 10A:
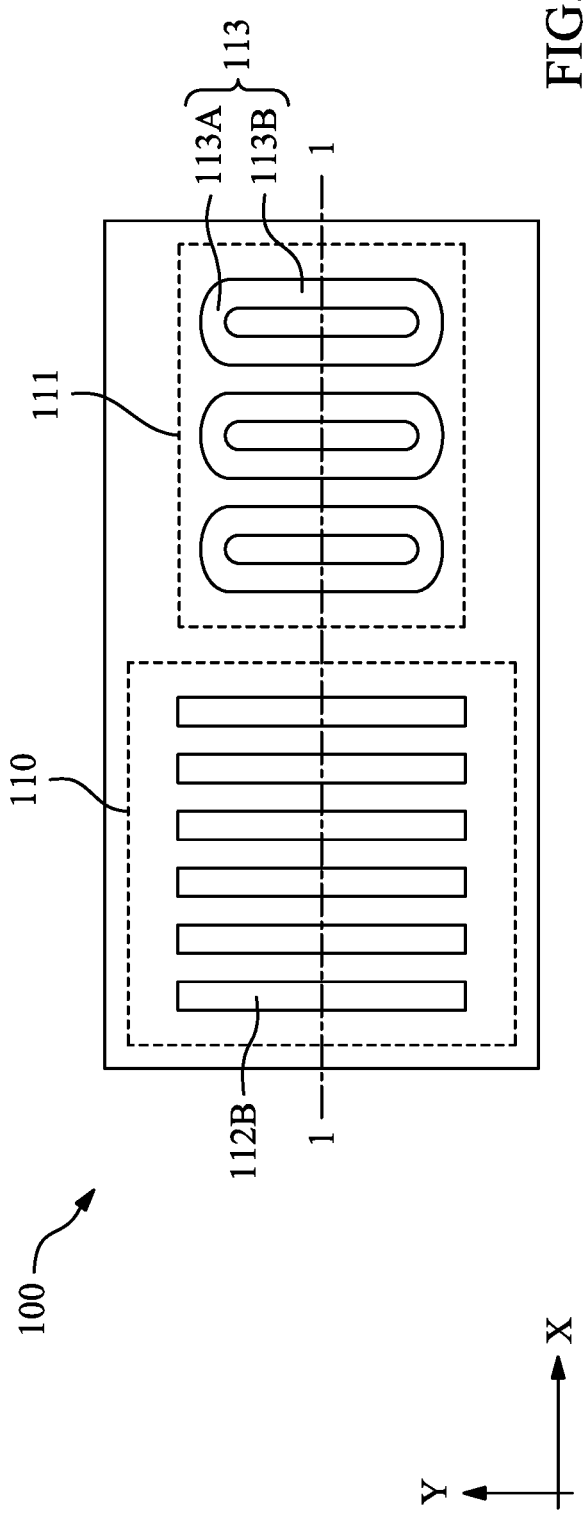
Figure 10B:
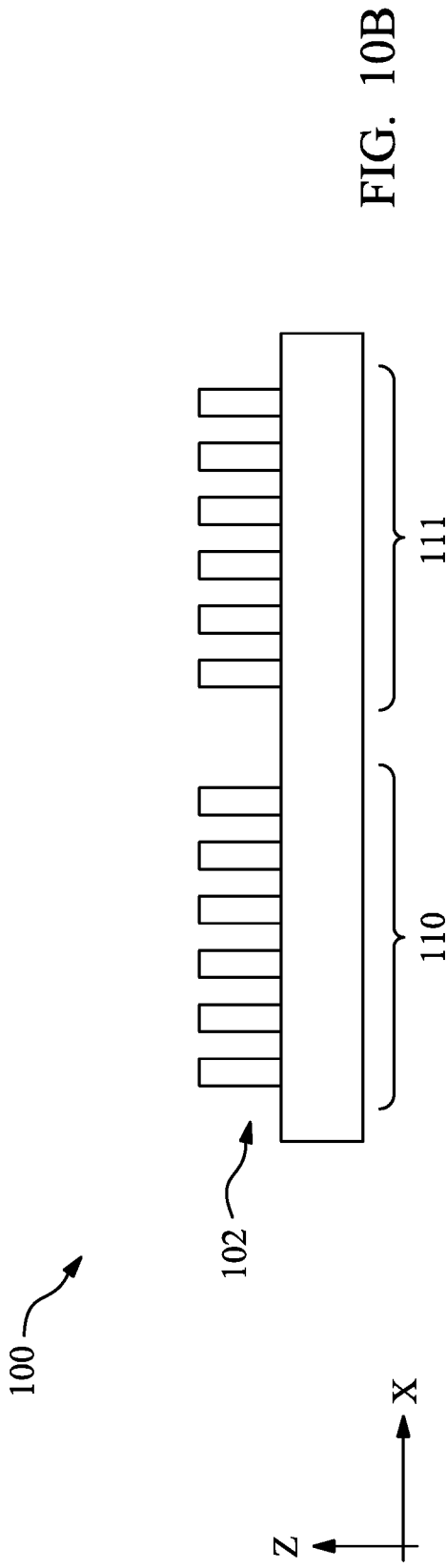

At operation 26, the method 10 (FIG. 1) transfers the patterns from the dielectric layer 104 to the substrate 102. Referring to FIGS. 10A and 10B, the substrate 102 is etched with the patterned dielectric layer 104 as an etch mask, thereby transferring the lines 112B and the spacers 113 to the substrate 102. In the present embodiment, the lines 112B are formed in the region 110 in the substrate 102, which is an area for forming active or passive devices; and the spacers 113 are formed in the region 111 in the substrate 102, which may be a circuit area or a non-circuit area. The lines 112B are substantially parallel and uniform. The spacers 113 each have a loop structure, having two curvy portions 113A connected by two relatively straight portions 113B.

At operation 28, the method 10 (FIG. 1) proceeds to further steps to form a final device using at least the lines 112B. For example, operation 28 may include forming doped regions, forming isolation features, forming gate stacks, forming interconnect layers and metal wires, and various other fabrication steps.

Figure 11:
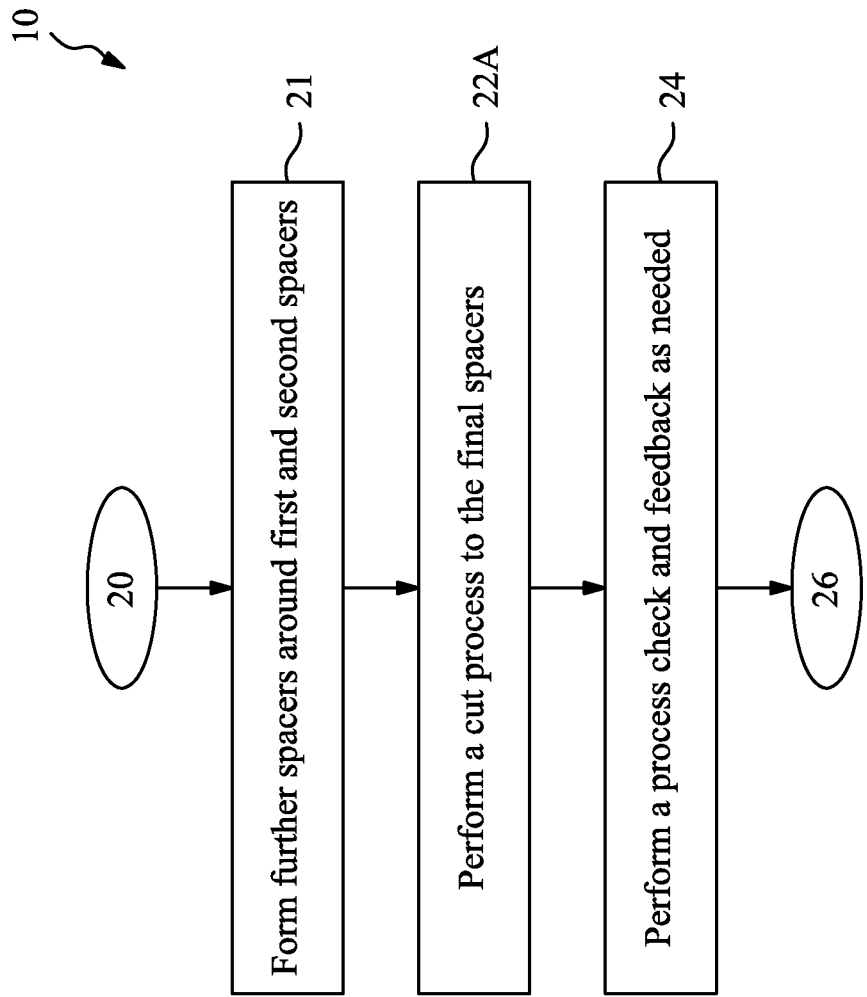
FIG. 11 shows a flowchart of an embodiment of the method of FIG. 1.

FIG. 11 illustrates a flowchart of an embodiment of the method 10, according to various aspects of the present disclosure. FIG. 11 is briefly discussed below in conjunction with FIGS. 12A-17A, 12B-17B, and 18A-18D.

Referring to FIG. 11, the method 10 in this embodiment proceeds to operation 21 from operation 20. At operation 21, the method 10 forms further spacers around the first and second spacers 112 and 113. As discussed above, the spacers 112 and 113 help reduce the pitch of the final patterns by half compared to the pitch of the mandrel patterns 108 and 109. Following the same rationale, operation 21 may reduce the pitch of the final patterns by a quarter, an eighth, and so on by forming two, three, or more levels of spacer. In each repetition, the spacer formed in a previous repetition is used as the mandrel pattern for another spacer. One example of operation 21 is shown in FIGS. 12A-15B.

Figure 12A:
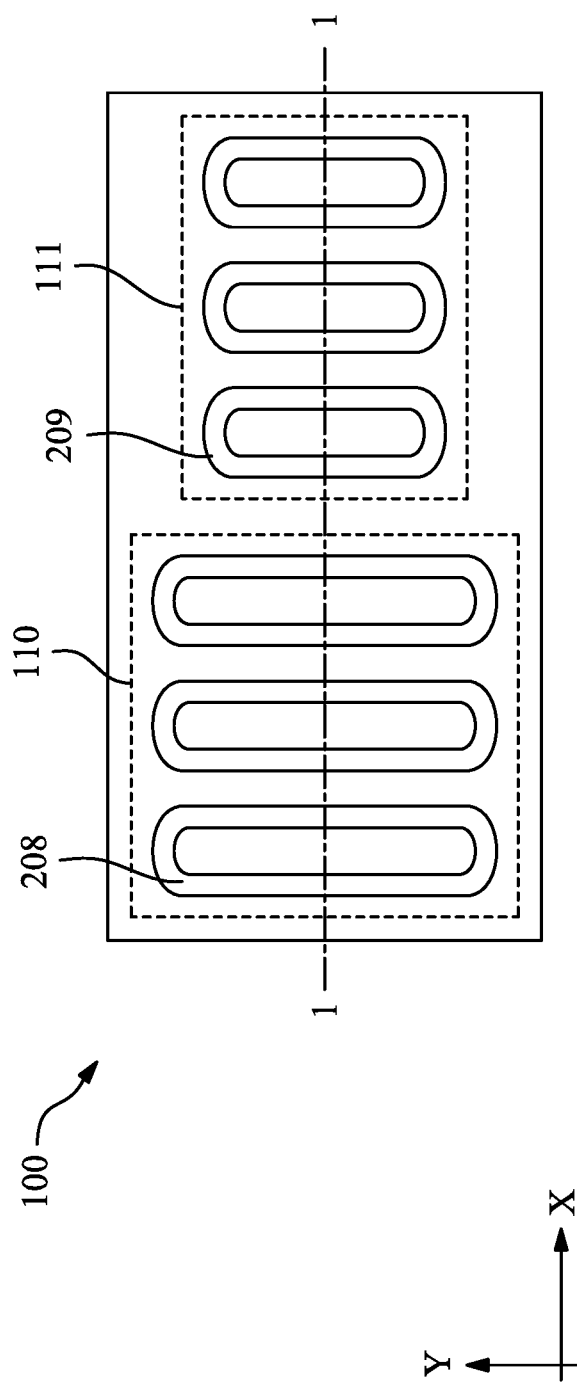
FIGS. 12A, 13A, 14A, 15A, 16A, and 17A illustrate top views of a device in various manufacturing steps of the method in FIGS. 1 and 11, in accordance with some embodiments.
Figure 12B:
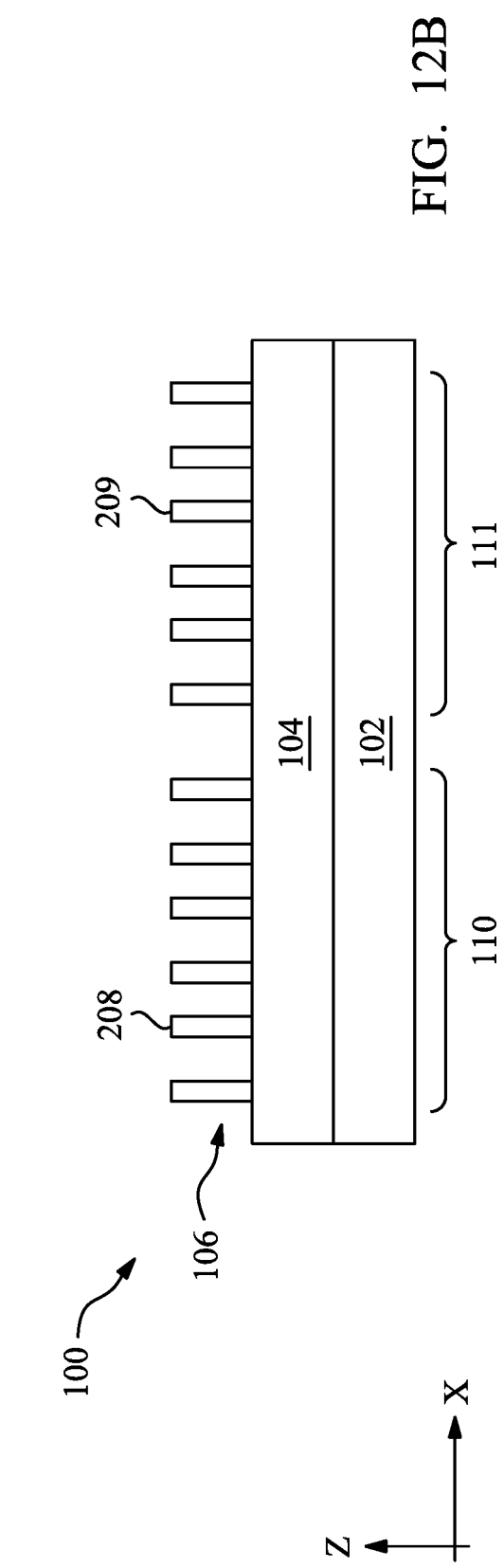
FIGS. 12B, 13B, 14B, 15B, 16B, and 17B illustrate cross-sectional views of the device in FIGS. 12A-17A along the "1-1" line therein, respectively, in various manufacturing steps of the method in FIGS. 1 and 11, in accordance with some embodiments.

Referring to FIGS. 12A and 12B, mandrel patterns 208 and 209 are formed in the dielectric layer 106 and each have a loop structure. In an embodiment, the mandrel patterns 208 and 209 may be transferred to the dielectric layer 106 from a spacer pattern formed in a layer (not shown) above the dielectric layer 106, e.g., as a result of operation 20. Alternatively, the mandrel patterns 208 and 209 may be formed by an embodiment of operation 14.

Figure 13A:
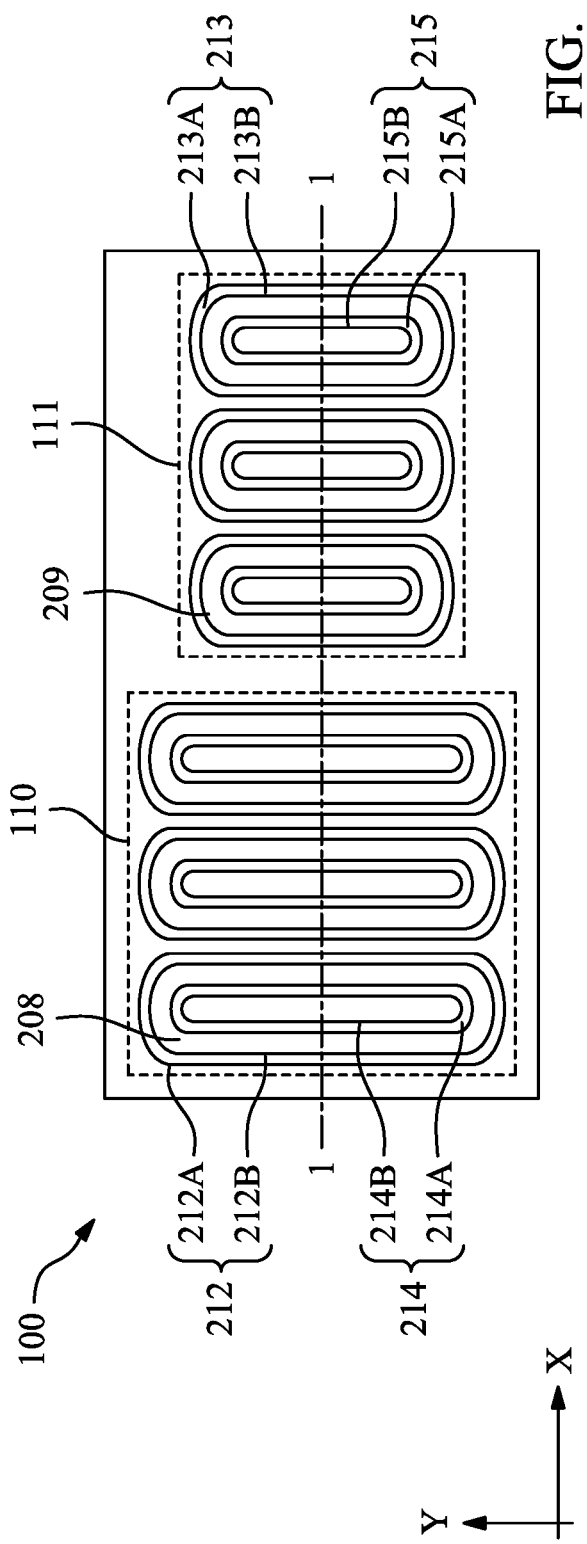
Figure 13B:
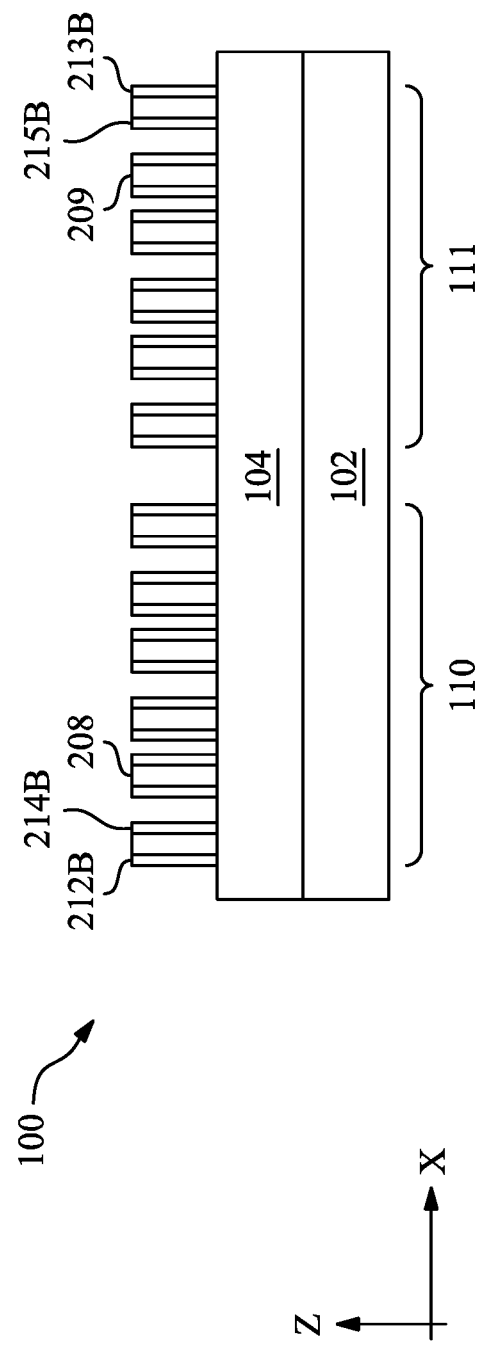

Referring to FIGS. 13A and 13B, spacers are formed on sidewalls of the mandrel patterns 208 and 209. Specifically, each of the spacers on the sidewalls of the mandrel patterns 208 includes an outer loop structure 212 (also called spacer 212) and an inner loop structure 214 (also called spacer 214). The spacer 212 is disposed on the outer wall of the respective mandrel pattern 208, and the spacer 214 is disposed on the inside wall of the respective mandrel pattern 208. The spacer 212 has two curvy portions 212A connected by two straight walls 212B. The spacer 214 has two curvy portions 214A connected by two straight walls 214B. Similarly, each of the spacers on the sidewalls of the mandrel patterns 209 includes an outer loop structure 213 (also called spacer 213) and an inner loop structure 215 (also called spacer 215). The spacer 213 is disposed on the outer wall of the respective mandrel pattern 209 and has two curvy portions 213A connected by two straight walls 213B. The spacer 215 is disposed on the inside wall of the respective mandrel pattern 209 and has two curvy portions 215A connected by two straight walls 215B. The formation of the spacers 212, 213, 214, and 215 is similar to the formation of the spacers 112 and 113 as discussed above with respect to operation 16.

Figure 14A:
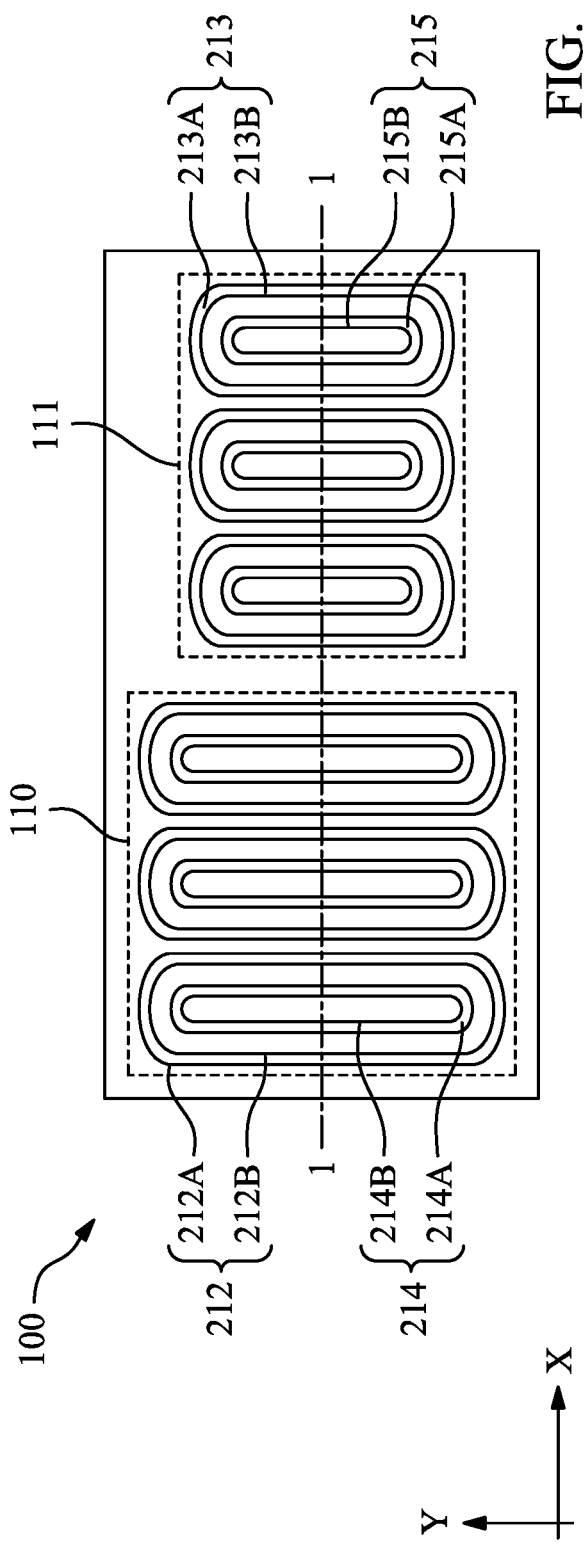
Figure 14B:
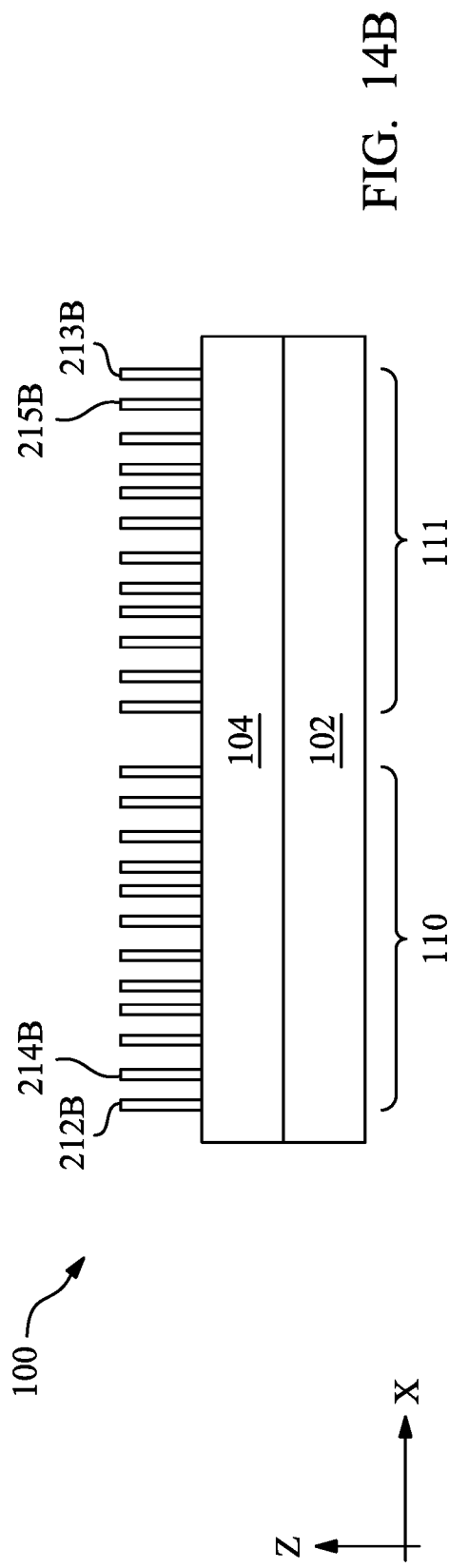

Referring to FIGS. 14A and 14B, the mandrel patterns 208 and 209 are removed by a selective etching process, similar to the removal of the mandrel patterns 108 and 109 in operation 18 above. As a result, double ring structures having the spacers 212, 213, 214, and 215 remain standing on the dielectric layer 104.

Figure 15A:
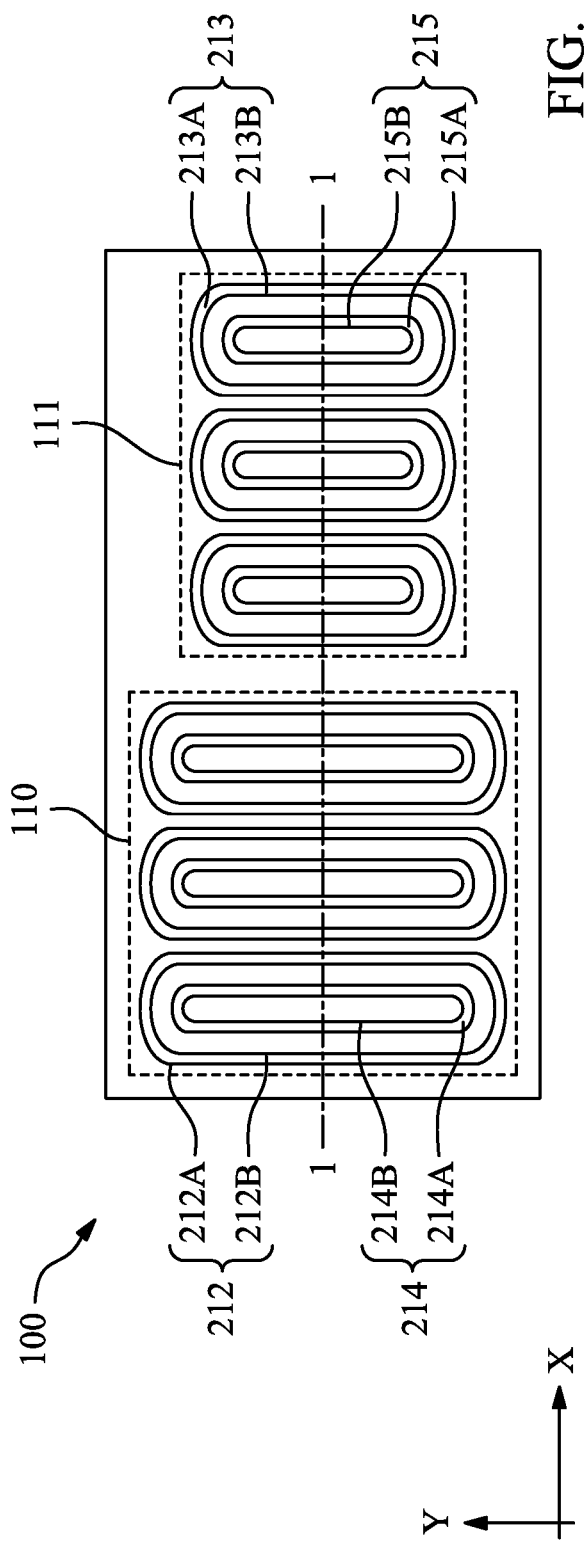
Figure 15B:
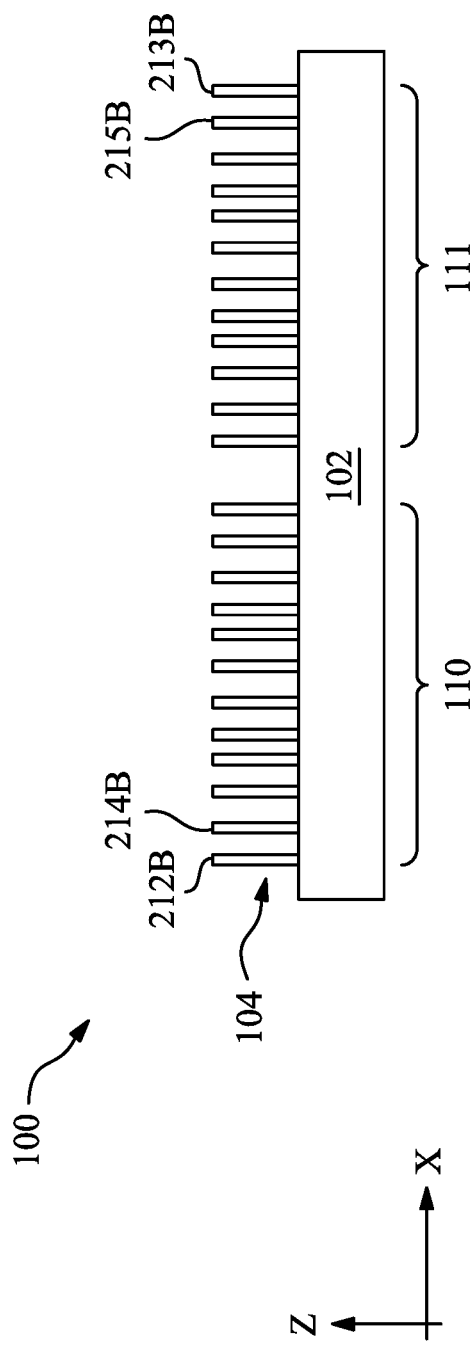

Referring to FIGS. 15A and 15B, the double ring structures are transferred from the dielectric layer 106 to the dielectric layer 104 by one or more etching processes, similar to the transferring of the spacers 112 and 113 in operation 20 above.

Figure 16A:
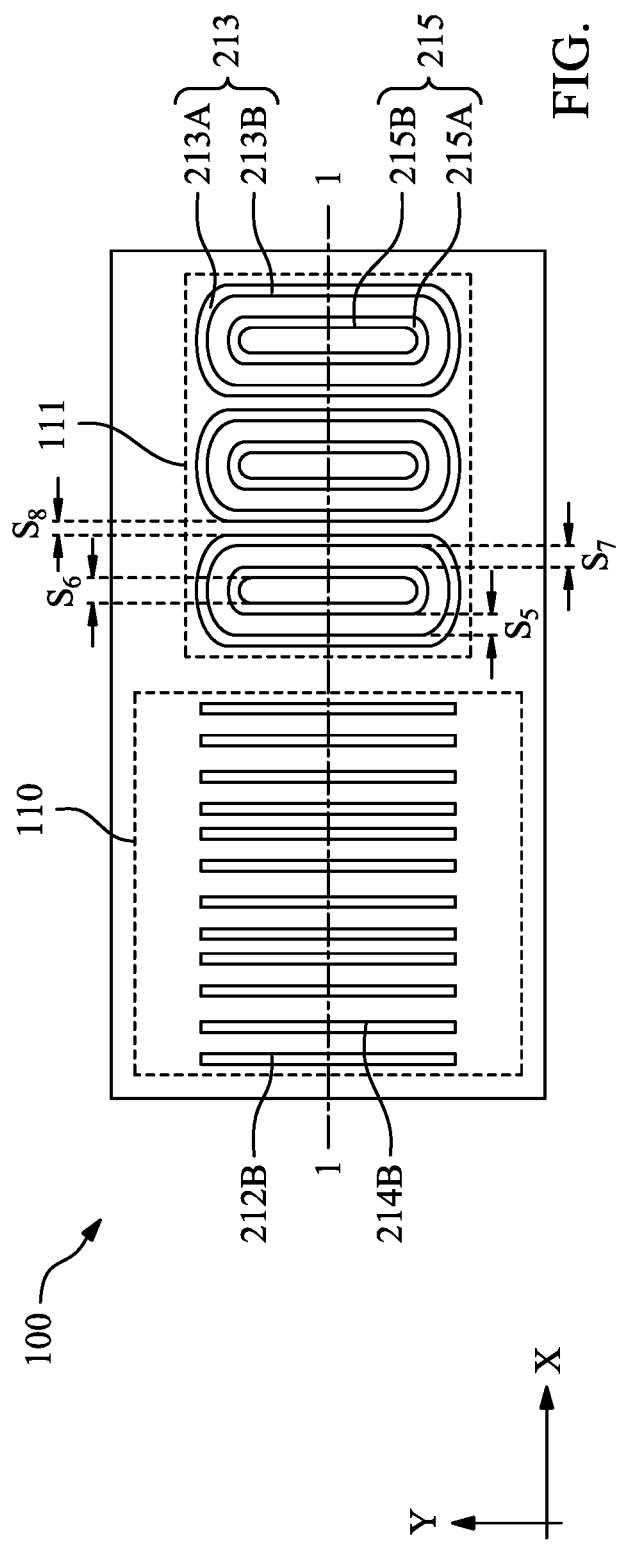
Figure 16B:
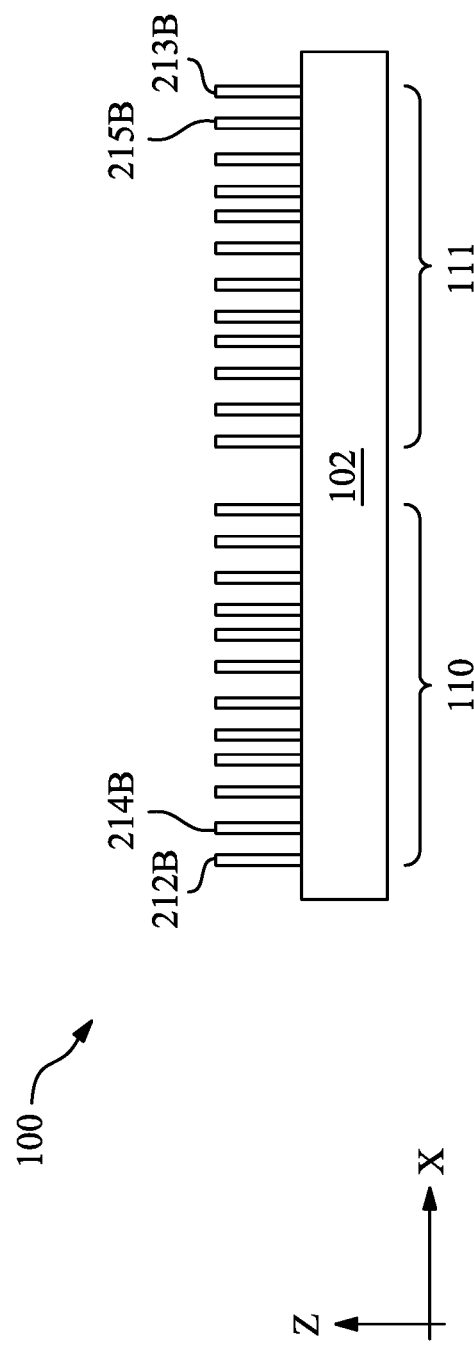

The method 10 (FIG. 11) proceeds to operation 22A which is an embodiment of operation 22 discussed above. At operation 22A, the method 10 performs a cut process to the spacers 212 and 214 in the region 110. In the present embodiment, the cut process removes the curvy portions from each of the spacers 212 and 214, thereby forming a set of substantially parallel lines 212B and 214B, as shown in FIGS. 16A and 16B. To further the present embodiment, the cut process does not remove the curvy portions of the spacers 213 and 215.

The method 10 (FIG. 11) proceeds to operation 24 to perform a process check with the patterns in the region 111. Consistent with the discussion above with respect to FIGS. 7A and 7B, operation 24 may measure various dimensions of the spacers 213 and 215, such as the spacing $S_5$, $S_6$, $S_7$, and $S_8$, as well as the width and pitch of the straight portions 213B and 215B. The various dimensions may be checked against some CD targets and feedback is generated as needed. For example, the spacing $S_6$ corresponds to the width of first mandrel patterns that is used for forming the mandrel pattern 209 as a spacer; the spacing $S_5$ and $S_7$ correspond to the width or wall thickness of the mandrel pattern 209; and the spacing $S_8$ relates to the pitch of the first mandrel patterns and various subsequent spacer-deposition and mandrel-etching processes. Operation 24 may provide feedback to the above fabrication processes for fine-tuning various process conditions.

Figure 17A:
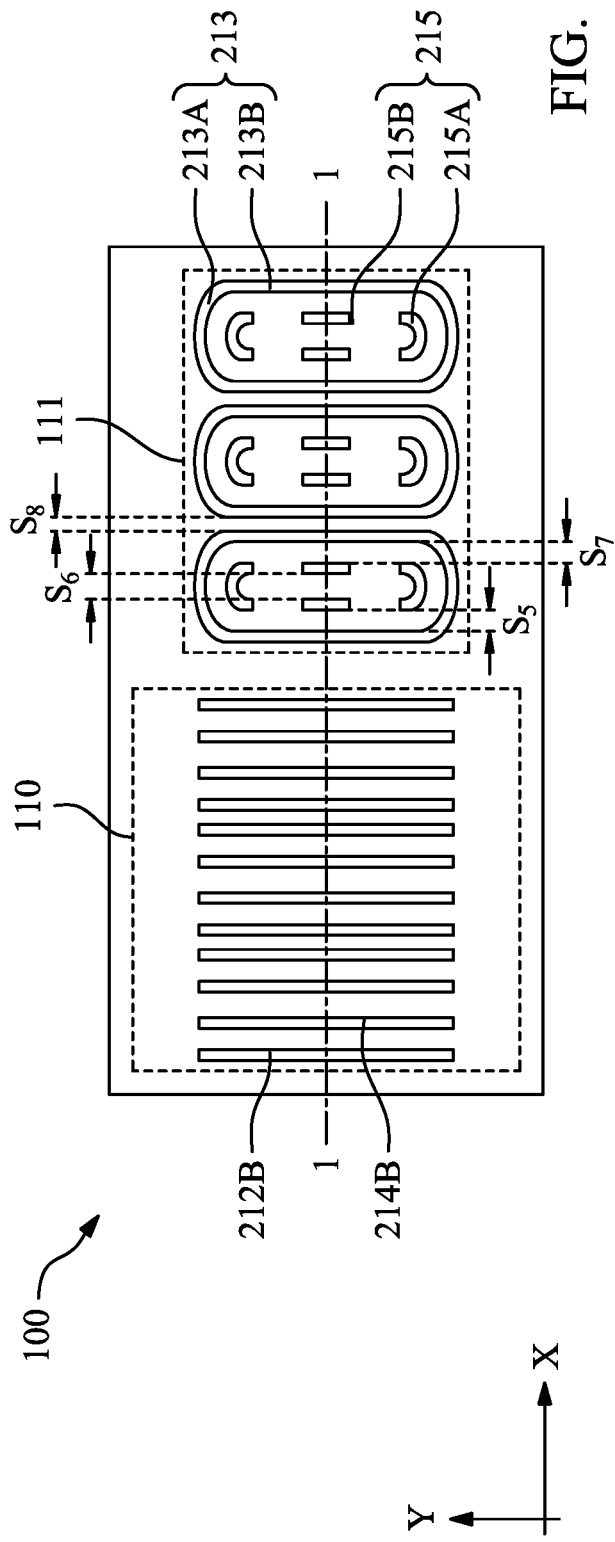
Figure 17B:
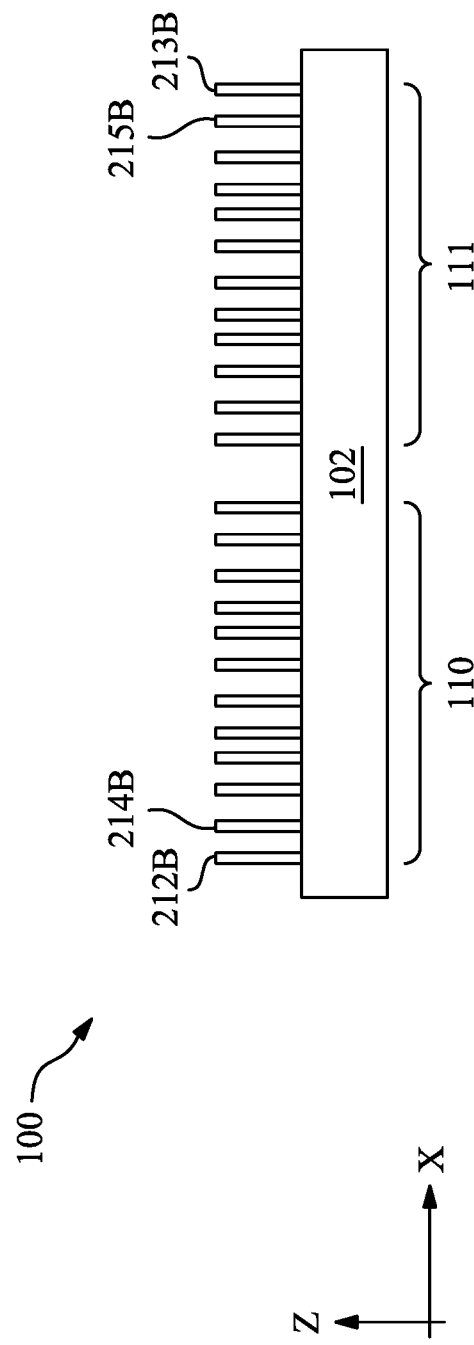

In an embodiment, the cut process in operation 22A partially removes the inner loop structures 215, as shown in FIGS. 17A and 17B. As a result, the inner loop structures 215 are cut into four segments, including two wall segments 215B and two curvy segments 215A. In the embodiment shown in FIG. 17A, the outer loop structures 213 are not cut, resulting a repeating pattern of short, short, long, and long along the "1-1" line. This repeating pattern can be easily located in a metrology tool and used for measuring the various dimensions discussed above.

Figures 18A, 18B:
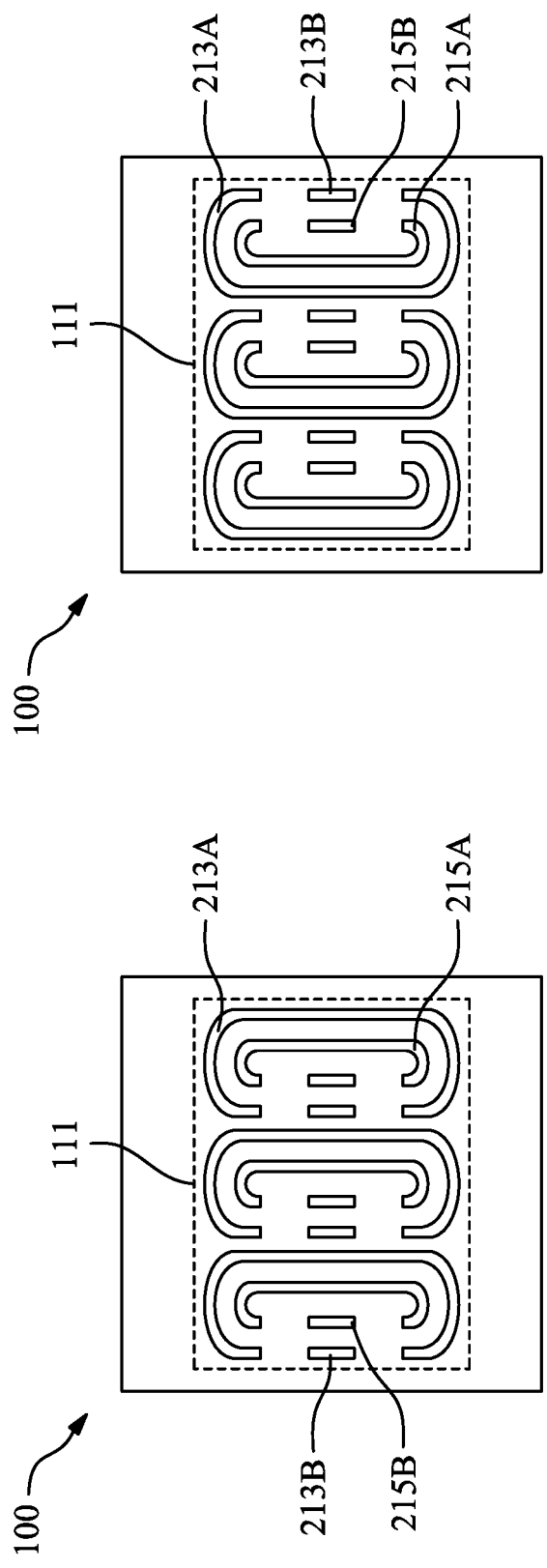
FIGS. 18A, 18B, 18C, and 18D illustrate top views of a device in a manufacturing step of the method in FIGS. 1 and 11, in accordance with some embodiments.

In another embodiment, the cut process in operation 22A partially removes the straight portions 213B and 215B, as shown in FIGS. 18A and 18B. As a result, each of the loop structures 213 and 215 are cut into two segments, including a shorter straight segment and a longer segment having the curvy portions. The spacers in FIGS. 18A and 18B also provide a repeating pattern of short, short, long, and long along the "1-1" line, which can be easily captured by a metrology tool.

Figures 18C, 18D:
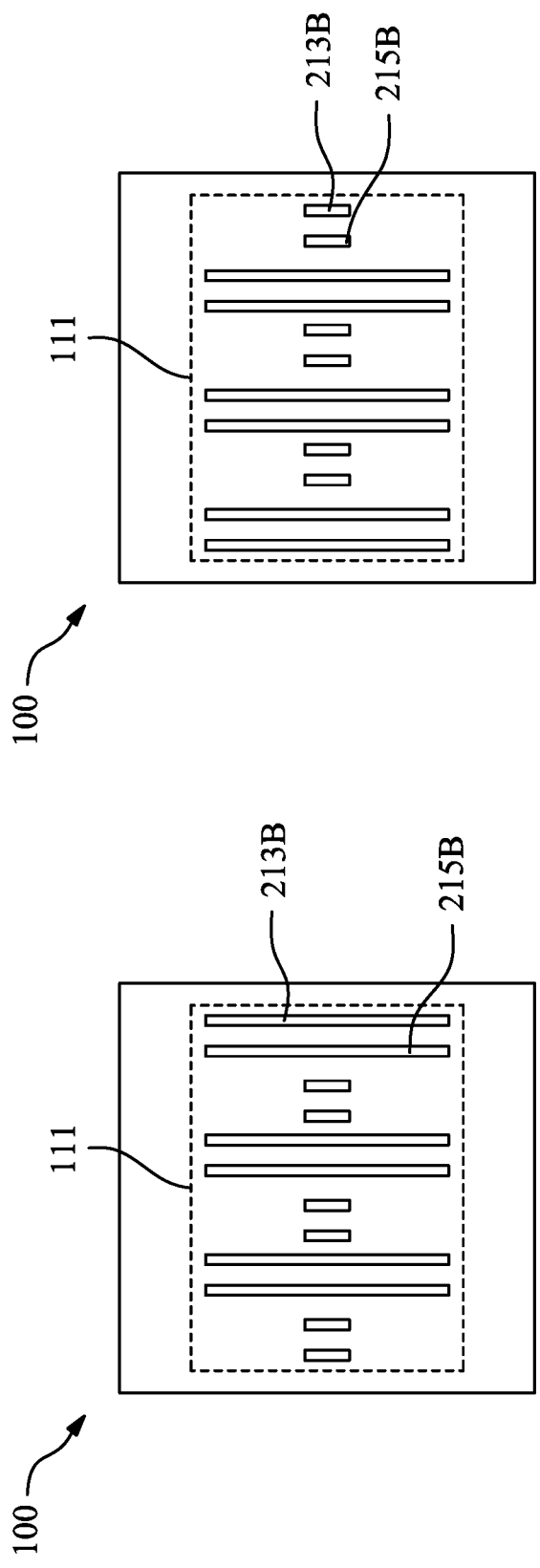

In yet another embodiment, the cut process in operation 22A partially removes the straight portions 213B and 215B and completely removes the curvy portions 213A and 215A, as shown in FIGS. 18C and 18D. As a result, the remaining straight portions of the spacers 213 and 215 in the region 111 provide a repeating pattern of short, short, long, and long, which can be easily located by a metrology tool.

Each of the repeating patterns in FIGS. 17A, 18A, 18B, 18C, and 18D provides a mapping between the dimensions of the patterns (e.g., pitch, width, and spacing) to the fabrication processes leading to these patterns. The mapping and the measurements can be used by operation 24 for monitoring and fine-tuning various process conditions. Various other cutting process to the spacers 213 and 215 (FIG. 16A) are contemplated by the present disclosure, as long as the final patterns provide a traceable mapping between the patterns' dimensions and the prior fabrication processes.

The method 10 (FIG. 11) proceeds to operation 26 to transfer the patterns from the dielectric layer 104 to the substrate 102, as discussed above.

Although not intended to be limiting, the present disclosure provides many benefits to the manufacturing of an IC. For example, embodiments of the present disclosure provide a pitch monitor pattern which is not used for forming circuits but for monitoring the circuit pattern formation processes. The pitch monitor pattern is relatively small compared to regular main patterns, and can be placed near the main patterns or in a distant area. After going through the same fabrication processes as the main patterns, the pitch monitor pattern provides a unique shape or configuration for quickly mapping various dimensions of the pitch monitor pattern back to the fabrication processes. This provides an efficient and effective approach for process fine-tuning, which otherwise would be difficult to accomplish with the main patterns alone.

In one exemplary aspect, the present disclosure is directed to a method. The method includes forming first mandrels and second mandrels over a substrate and forming first spacers on sidewalls of the first mandrels and second spacers on sidewalls of the second mandrels. Each of the first and second spacers has a loop structure with two curvy portions connected by two lines. The method further includes removing the first and second mandrels and removing the curvy portions from each of the first spacers without removing the curvy portions from any of the second spacers.

In an embodiment, the method further includes measuring spacing between two lines of one of the second spacers and checking the spacing according to a critical dimension (CD) target. If the spacing does not meet the CD target, the method further includes adjusting process conditions for the forming of the first and second mandrels.

In an embodiment, the method further includes measuring spacing between a line of one of the second spacers and an adjacent line of another one of the second spacers and checking the spacing according to a critical dimension (CD) target. If the spacing does not meet the CD target, the method further includes adjusting process conditions for at least one of: the forming of the first and second spacers, and the removing of the first and second mandrels.

In another exemplary aspect, the present disclosure is directed to a method. The method includes forming first mandrels and second mandrels over a substrate, wherein each of the first and second mandrels has a loop structure. The method further includes forming first spacers on sidewalls of the first mandrels and second spacers on sidewalls of the second mandrels. Each of the first and second spacers has an inner loop structure inside the respective mandrel and an outer loop structure outside the respective mandrel. Each of the inner and outer loop structures has two curvy ends connected by two walls. The method further includes removing the first and second mandrels and partially removing walls of each second spacer, resulting in two adjacent wall segments from each second spacer. The two adjacent wall segments are not connected to remaining portions of the respective second spacer.

In an embodiment of the method, the two adjacent wall segments are cut from the inner loop structure of the respective second spacer. In another embodiment of the method, one of the two adjacent wall segments is cut from the inner loop structure of the respective second spacer, and another one of the two adjacent wall segments is cut from the outer loop structure of the respective second spacer.

In an embodiment of the method, the partially removing of the walls of each second spacer also removes the curvy ends from each of the first spacers. In yet another embodiment of the method, the partially removing of the walls of each second spacer also removes the curvy ends from each of the second spacers.

In another exemplary aspect, the present disclosure is directed to a method. The method includes forming first lines and second lines over a substrate by a first patterning process and forming first spacers on sidewalls of the first lines and second spacers on sidewalls of the second lines. Each of the first and second spacers has a loop structure with two curvy portions connected by two straight portions. The method further includes removing the first and second lines by an etching process and performing a cut process, thereby removing the curvy portions from each of the first spacers without removing the curvy portions from any of the second spacers.

In an embodiment, the method further includes measuring first spacing between two straight portions of a second spacer; measuring second spacing between one of the two straight portions of the second spacer and an adjacent straight portion of another second spacer; and checking the first and second spacing against a critical dimension (CD) target. If either the first spacing or the second spacing does not meet the CD target, the method further includes adjusting process conditions for one of: the first patterning process, the forming of the first and second spacers, and the removing of the first and second lines.

The foregoing outlines features of several embodiments so that those having ordinary skill in the art may better understand the aspects of the present disclosure. Those having ordinary skill in the art should appreciate that they may readily use the present disclosure as a basis for designing or modifying other processes and structures for carrying out the same purposes and/or achieving the same advantages of the embodiments introduced herein. Those having ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first line and a second line over a substrate by a first patterning process;

forming a first spacer on sidewalls of the first line and a second spacer on sidewalls of the second line, each of the first and second spacers having a loop structure with two curvy portions connected by two straight portions, the first and second spacers having different material compositions from the first and second lines;

removing the first and second lines by a selective etching process; and performing a cut process, thereby removing the two curvy portions from the first spacer without removing the two curvy portions from the second spacer by masking at least the two curvy portions from the second spacer.

2. The method of claim 1, further comprising:

measuring spacing between the two straight portions of the second spacer; and checking the spacing against a critical dimension (CD) target.

3. The method of claim 2, further comprising:

upon a condition that the spacing does not meet the CD target, adjusting process conditions for one of:
the first patterning process;
the forming of the first and second spacers; and
the removing of the first and second lines.

4. The method of claim 1, wherein the first and second lines are oriented lengthwise in the same direction and have the same width, and wherein the second line is shorter in length than the first line.

5. The method of claim 1, wherein the first line is formed in a circuit area of the substrate and the second line is formed in a non-circuit area of the substrate.

6. The method of claim 1, further comprising:

transferring the first and second spacers to a dielectric layer of the substrate by a second patterning process.

7. The method of claim 6, wherein the transferring of the first and second spacers is before the performing of the cut process.

8. The method of claim 1, wherein the performing of the cut process also partially removes one of the two straight portions of the second spacer, thereby splitting the second spacer into a first segment and a second segment.

9. The method of claim 8, wherein the first segment includes the two curvy portions of the second spacer and is between the second segment and the first spacer.

10. A method, comprising:

forming a first mandrel and a second mandrel over a substrate by a first patterning process, wherein the first and second mandrels have different lengths;

forming a first spacer on sidewalls of the first mandrel and a second spacer on sidewalls of the second mandrel, each spacer having a loop structure with curvy portions connected by straight portions, the first and second spacers having different material compositions from the first and second mandrels;

removing the first and second mandrels by a first etching process; and removing the curvy portions from the first spacer without removing the curvy portions from the second spacer by at least partially masking the second spacer in a second etching process.

11. The method of claim 10, wherein the straight portions of the second spacer include two walls, further comprising:

measuring spacing between the two walls;

checking the spacing according to a critical dimension (CD) target; and upon a condition that the spacing does not meet the CD target, adjusting process parameters used in the first patterning process.

12. The method of claim 10, further comprising:

before the removing of the curvy portions, transferring the first and second spacers to a dielectric layer of the substrate by a second patterning process.

13. The method of claim 10, wherein:

each of the first and second mandrels has a loop structure having an inner sidewall and an outer sidewall opposing the inner sidewall;

the first spacer has an outer loop layer disposed on the outer sidewall of the first mandrel and an inner loop layer disposed on the inner sidewall of the first mandrel; and the second spacer has an outer loop layer disposed on the outer sidewall of the second mandrel and an inner loop layer disposed on the inner sidewall of the second mandrel.

14. The method of claim 13, wherein the removing of the curvy portions also partially removes the straight portions of the inner loop layer of the second spacer, resulting in two line segments surrounded by the outer loop layer of the second spacer.

15. The method of claim 13, wherein the removing of the curvy portions also partially removes from the second spacer one of the straight portions of the inner loop layer and one of the straight portions of the outer loop layer, resulting in two adjacent line segments in the second spacer.

16. A method, comprising:

forming a first mandrel and a second mandrel over a substrate by a photolithography process, wherein each of the first and second mandrels has a loop structure having an inner sidewall and an outer sidewall opposing the inner sidewall;

forming a first spacer on the outer sidewall of the first mandrel, a second spacer on the inner sidewall of the first mandrel, a third spacer on the outer sidewall of the second mandrel, and a fourth spacer on the inner sidewall of the second mandrel, wherein each of the first, second, third, and fourth spacers has two curvy ends connected by two walls;

removing the first and second mandrels in a selective etching process; and removing the two curvy ends from each of the first and second spacers without removing the two curvy ends from either the third or fourth spacer by at least partially masking the third and fourth spacers in a cut process.

17. The method of claim 16, wherein the removing of the two curvy ends also partially removes at least one of the two walls of the fourth spacer, resulting in a wall segment not connected to remaining portions of the fourth spacer.

18. The method of claim 16, wherein the removing of the two curvy ends also partially removes each of the two walls of the fourth spacer.

19. The method of claim 16, wherein the removing of the two curvy ends also partially removes at least one of the two walls of the third spacer, resulting in a wall segment not connected to remaining portions of the third spacer.

20. The method of claim 19, wherein the wall segment is adjacent to one of the two walls of the first spacer.

* * * * *